United States Patent [19]
Papamarcos et al.

[11] Patent Number: 6,148,275
[45] Date of Patent: Nov. 14, 2000

[54] SYSTEM FOR AND METHOD OF CONNECTING A HARDWARE MODELING ELEMENT TO A HARDWARE MODELING SYSTEM

[75] Inventors: Mark Stanley Papamarcos, San Jose; Andrew Jefferson Read, Sunnyvale; Wayne Phillip Heideman, San Jose; Robert Kristianto Mardjuki, Peasanton; Robert Kimberly Couch, Santa Cruz; Peter Ralph Jaeger; William Fitch Kappauf, both of San Jose; Melvin Rudin, Los Altsо; Norman Francis Kelly, San Jose; Lawrence Curtis Widdoes, Jr., Los Altos Hill, all of Calif.

[73] Assignee: Synopsys, Inc., Mountain View, Calif.

[21] Appl. No.: 08/919,635

[22] Filed: Aug. 28, 1997

Related U.S. Application Data

[63] Continuation of application No. 08/312,198, Sep. 26, 1994, which is a continuation of application No. 07/780,529, Oct. 18, 1991, Pat. No. 5,369,593, which is a continuation of application No. 07/359,624, May 31, 1989, abandoned.

[51] Int. Cl.[7] .............................. G06F 17/50; H01R 3/00
[52] U.S. Cl. ............................................. 703/13; 439/490
[58] Field of Search .................... 364/488, 489, 364/490, 578; 703/13; 439/490

[56] References Cited

U.S. PATENT DOCUMENTS

| | | | |
|---|---|---|---|
| 3,016,698 | 1/1962 | Sobey | 60/35.6 |
| 3,287,702 | 11/1966 | Borck, Jr. et al. | 340/172.5 |
| 3,287,703 | 11/1966 | Slotnick | 340/172.5 |
| 3,473,160 | 10/1969 | Wahlstrom | 340/172.5 |
| 3,581,286 | 5/1971 | Beausoleil . | |
| 3,585,599 | 6/1971 | Hitt et al. . | |
| 3,720,131 | 3/1973 | Frohock, Jr. et al. | 89/41 ME |
| 3,728,534 | 4/1973 | Bertram et al. | 235/184 |
| 3,764,995 | 10/1973 | Helf, Jr. et al. | 340/172.5 |
| 3,832,535 | 8/1974 | De Vito | 235/153 AC |

(List continued on next page.)

*Primary Examiner*—Kevin J. Teska
*Assistant Examiner*—Hugh Jones
*Attorney, Agent, or Firm*—Haverstock & Owens LLP

[57] ABSTRACT

An improved system or and method of connecting a hardware modeling element to the pin electronics circuitry of a hardware modeling system, with the improved system having circuitry and structures that will allow it to be connected to a hardware modeling system that is powered, circuitry to indicate to the pin electronics circuitry that the improved system is connected to it, circuitry to identify the hardware modeling element supported by the improved system to the hardware modeling system, circuitry to indicate to the hardware modeling system when the hardware modeling element is initialized so evaluation of it by the hardware modeling system can commence, circuitry to generate selectable supply voltages for the powering the hardware modeling element, and a hardware modeling element connector that will allow the connection of a family of hardware modeling elements to the same connector without the need to change the connector.

69 Claims, 8 Drawing Sheets

U.S. PATENT DOCUMENTS

| | | | |
|---|---|---|---|
| 3,854,125 | 12/1974 | Ehling et al. | 340/172.5 |
| 3,902,050 | 8/1975 | Schmidt et al. | 235/152 |
| 3,913,070 | 10/1975 | Malcolm et al. | 340/172.5 |
| 3,922,537 | 11/1975 | Jackson | 235/153 AC |
| 3,928,730 | 12/1975 | Aagaard et al. | 179/18 GF |
| 3,976,940 | 8/1976 | Chau et al. | 324/73 R |
| 4,020,469 | 4/1977 | Manning | 340/172.5 |
| 4,032,893 | 6/1977 | Moran | 340/166 R |
| 4,032,899 | 6/1977 | Jenny et al. | 364/200 |
| 4,055,801 | 10/1977 | Pike et al. | 324/73 R |
| 4,092,589 | 5/1978 | Chau et al. | 324/73 R |
| 4,102,491 | 7/1978 | DeVito et al. | 235/302 |
| 4,168,796 | 9/1979 | Fulks et al. | 235/302 |
| 4,216,533 | 8/1980 | Ichimiya et al. | 365/230 |
| 4,236,246 | 11/1980 | Skilling | 371/27 |
| 4,306,286 | 12/1981 | Cocke et al. | 364/200 |
| 4,357,678 | 11/1982 | Davis | 364/900 |
| 4,365,294 | 12/1982 | Stokken | 364/200 |
| 4,386,403 | 5/1983 | Hsieh et al. | 364/300 |
| 4,404,635 | 9/1983 | Flaker | 364/481 |
| 4,450,560 | 5/1984 | Conner | 371/25 |
| 4,456,880 | 6/1984 | Warner et al. | 324/158 D |
| 4,459,694 | 7/1984 | Ueno et al. | 371/21 |
| 4,488,354 | 12/1984 | Chan et al. | 29/830 |
| 4,503,386 | 3/1985 | DasGupta et al. | 324/73 |
| 4,510,602 | 4/1985 | Engdahl et al. | 371/21 |
| 4,517,661 | 5/1985 | Graf et al. | 364/900 |
| 4,525,789 | 7/1985 | Kemper et al. | 364/481 |
| 4,527,115 | 7/1985 | Mehrotra et al. | 324/73 R |
| 4,527,249 | 7/1985 | Van Brunt | 364/578 |
| 4,539,564 | 9/1985 | Smithson | 340/825.79 |
| 4,541,071 | 9/1985 | Ohmori | 364/900 |
| 4,544,882 | 10/1985 | Flora | 324/73 |
| 4,577,276 | 3/1986 | Dunlop et al. | 364/491 |
| 4,578,761 | 3/1986 | Gray | 364/481 |
| 4,587,625 | 5/1986 | Marino, Jr. et al. | 364/578 |
| 4,590,581 | 5/1986 | Widdoes, Jr. | 364/578 |
| 4,593,363 | 6/1986 | Burstein et al. | 364/491 |
| 4,594,544 | 6/1986 | Necoechea | 324/73 AT |
| 4,600,846 | 7/1986 | Burrows | 307/465 |
| 4,612,618 | 9/1986 | Pryor et al. | 364/490 |
| 4,613,940 | 9/1986 | Shenton et al. | 364/490 |
| 4,621,339 | 11/1986 | Wagner et al. | 364/900 |
| 4,628,471 | 12/1986 | Schuler et al. | 364/578 |
| 4,633,417 | 12/1986 | Wilburn et al. | 364/550 |
| 4,635,218 | 1/1987 | Widdoes, Jr. | 364/578 |
| 4,635,259 | 1/1987 | Schinabeck et al. | 371/20 |
| 4,639,664 | 1/1987 | Chiu et al. | 324/73 AT |
| 4,642,487 | 2/1987 | Carter | 307/465 |
| 4,644,487 | 2/1987 | Smith | 364/578 |
| 4,646,299 | 2/1987 | Schinabeck et al. | 371/20 |
| 4,656,580 | 4/1987 | Hitchcock, Sr. et al. | 364/200 |
| 4,656,592 | 4/1987 | Spaanenburg et al. | 364/490 |
| 4,656,632 | 4/1987 | Jackson | 371/20 |
| 4,674,089 | 6/1987 | Poret et al. | 371/25 |
| 4,675,673 | 6/1987 | Oliver | 340/825.87 |
| 4,675,832 | 6/1987 | Robinson et al. | 364/521 |
| 4,682,440 | 7/1987 | Hunter | 43/61 |
| 4,686,627 | 8/1987 | Donovan et al. | 364/481 |
| 4,695,740 | 9/1987 | Carter | 307/242 |
| 4,695,968 | 9/1987 | Sullivan, II et al. | 364/578 |
| 4,695,999 | 9/1987 | Lebizay | 370/58 |
| 4,697,241 | 9/1987 | Lavi | 364/488 |
| 4,700,187 | 10/1987 | Furtek | 340/825.83 |
| 4,713,557 | 12/1987 | Carter | 307/242 |
| 4,714,875 | 12/1987 | Bailey et al. | 324/73 PC |
| 4,722,084 | 1/1988 | Morton | 371/9 |
| 4,724,378 | 2/1988 | Murray et al. | 324/73 R |
| 4,725,835 | 2/1988 | Schreiner et al. | 340/825.83 |
| 4,725,970 | 2/1988 | Burrows et al. | 364/578 |
| 4,740,919 | 4/1988 | Elmer | 365/104 |
| 4,744,084 | 5/1988 | Beck et al. | 371/23 |
| 4,747,102 | 5/1988 | Funatsu | 371/23 |
| 4,752,887 | 6/1988 | Kuwahara | 364/491 |
| 4,758,745 | 7/1988 | Elgamal et al. | 307/465 |
| 4,761,768 | 8/1988 | Turner et al. | 365/201 |
| 4,763,288 | 8/1988 | Deering et al. | 364/578 |
| 4,763,289 | 8/1988 | Barzilai et al. | 364/578 |
| 4,764,925 | 8/1988 | Grimes et al. | 371/25 |
| 4,766,569 | 8/1988 | Turner et al. | 365/185 |
| 4,768,196 | 8/1988 | Jou et al. | 371/25 |
| 4,769,817 | 9/1988 | Krohn et al. | 371/23 |
| 4,771,428 | 9/1988 | Acuff et al. | 371/25 |
| 4,777,606 | 10/1988 | Fournier | 364/491 |
| 4,782,440 | 11/1988 | Nomizu et al. | 364/200 |
| 4,787,061 | 11/1988 | Nei et al. | 364/900 |
| 4,788,708 | 11/1988 | Hendrix | 379/6 |
| 4,791,602 | 12/1988 | Resnick | 364/900 |
| 4,803,636 | 2/1989 | Nishiyama et al. | 364/491 |
| 4,806,852 | 2/1989 | Swan et al. | 324/73 |
| 4,811,214 | 3/1989 | Nosenchuck et al. | 364/200 |
| 4,815,003 | 3/1989 | Putatunda et al. | 364/491 |
| 4,816,750 | 3/1989 | Van der Kloot et al. | 324/73 R |
| 4,823,276 | 4/1989 | Hiwatashi | 364/491 |
| 4,827,427 | 5/1989 | Hyduke | 364/489 |
| 4,835,705 | 5/1989 | Fujino et al. | 364/491 |
| 4,845,633 | 7/1989 | Furtek | 364/490 |
| 4,849,904 | 7/1989 | Aipperspach et al. | 364/489 |
| 4,849,928 | 7/1989 | Hauck | 364/900 |
| 4,849,944 | 7/1989 | Matsushita | 439/60 |
| 4,855,669 | 8/1989 | Mahoney | 324/73 R |
| 4,862,347 | 8/1989 | Rudy | 364/200 |
| 4,864,165 | 9/1989 | Hoberman et al. | 307/467 |
| 4,870,302 | 9/1989 | Freeman | 307/465 |
| 4,873,459 | 10/1989 | El Gamal et al. | 307/465 |
| 4,876,466 | 10/1989 | Kondou et al. | 307/465 |
| 4,882,690 | 11/1989 | Shinsha et al. | 364/490 |
| 4,901,259 | 2/1990 | Watkins | 364/578 |
| 4,901,260 | 2/1990 | Lubachevsky | 364/578 |
| 4,908,772 | 3/1990 | Chi | 364/491 |
| 4,914,612 | 4/1990 | Beece et al. | 364/578 |
| 4,918,440 | 4/1990 | Furtek | 340/825.83 |
| 4,918,594 | 4/1990 | Onizuka | 364/200 |
| 4,922,432 | 5/1990 | Kobayashi et al. | 364/490 |
| 4,924,429 | 5/1990 | Kurashita et al. | 364/578 |
| 4,931,723 | 6/1990 | Jeffrey et al. | 371/22.3 |
| 4,931,946 | 6/1990 | Ravindra et al. | 364/490 |
| 4,935,734 | 6/1990 | Austin | 340/825.83 |
| 4,942,536 | 7/1990 | Watanabe et al. | 364/490 |
| 4,942,615 | 7/1990 | Hirose | 364/578 |
| 4,945,503 | 7/1990 | Takasaki | 364/578 |
| 4,949,275 | 8/1990 | Nonaka | 364/490 |
| 4,951,220 | 8/1990 | Ramacher et al. | 364/488 |
| 4,958,324 | 9/1990 | Devin | 365/201 |
| 4,965,739 | 10/1990 | Ng | 364/491 |
| 4,972,372 | 11/1990 | Ueno | 364/201 |
| 5,003,487 | 3/1991 | Drumm et al. | 364/489 |
| 5,023,775 | 6/1991 | Poret | 364/200 |
| 5,036,473 | 7/1991 | Butts et al. | 364/489 |
| 5,041,986 | 8/1991 | Tanishita | 364/489 |
| 5,046,017 | 9/1991 | Yuyama et al. | 364/491 |
| 5,051,938 | 9/1991 | Hyduke | 364/578 |
| 5,083,083 | 1/1992 | El-Ayat et al. | 324/158 R |
| 5,093,920 | 3/1992 | Agrawal et al. | 395/800 |
| 5,109,353 | 4/1992 | Sample et al. | 364/578 |

| | | | |
|---|---|---|---|
| 5,114,353 | 5/1992 | Sample | 439/65 |
| 5,126,966 | 6/1992 | Hafeman et al. | 364/500 |
| 5,146,460 | 9/1992 | Ackerman et al. | 371/23 |
| 5,202,593 | 4/1993 | Huang et al. | 307/475 |
| 5,253,363 | 10/1993 | Hyman | 395/800 |
| 5,259,006 | 11/1993 | Price et al. | 375/107 |
| 5,329,470 | 7/1994 | Sample et al. | 364/578 |
| 5,339,262 | 8/1994 | Rostoker et al. | 364/578 |
| 5,352,123 | 10/1994 | Sample et al. | 439/61 |
| 5,369,593 | 11/1994 | Papamarcos et al. | 364/488 |

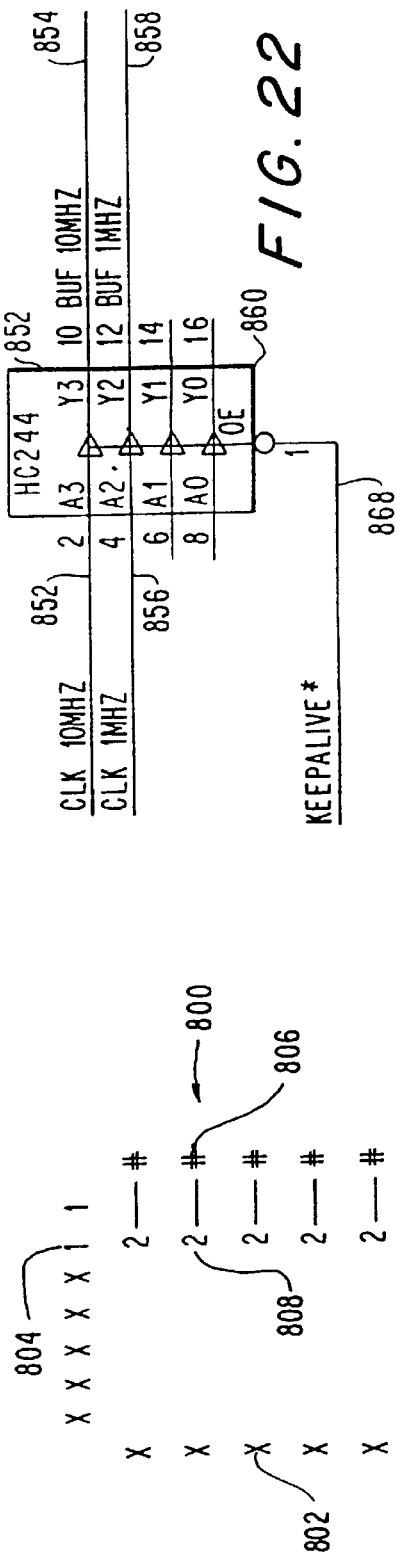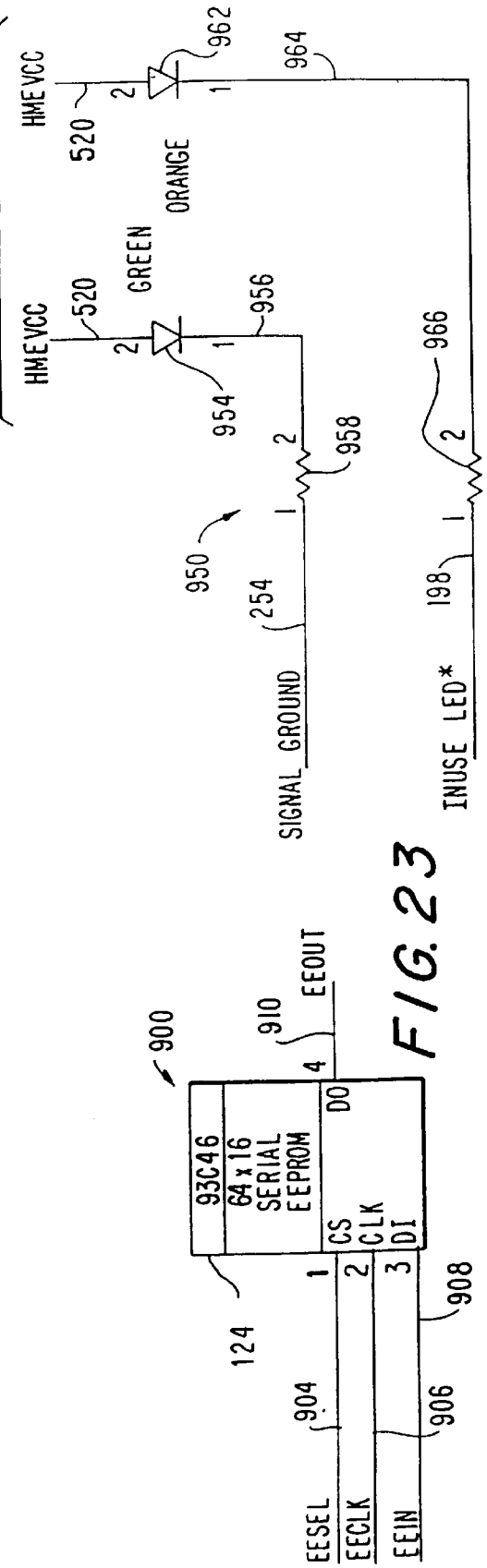

SYSTEM FOR AND METHOD OF CONNECTING A HARDWARE MODELING ELEMENT TO A HARDWARE MODELING SYSTEM

This is a File Wrapper Continuation of copending application Ser. No. 08/312,198 filed on Sep. 26, 1994, which is a Continuation of application Ser. No. 07/780,529, filed Oct. 18, 1991, now U.S. Pat. No. 5,369,593, which is a continuation of 07/359,624, filed May. 31, 1989, now abandoned.

FIELD OF THE INVENTION

The present invention relates to adapter systems used to connect hardware modeling elements to the pin electronics circuitry of a hardware modeling system.

BACKGROUND OF THE INVENTION

Hardware modeling systems ("HMS") provide integrated circuit designers with a tool for making accurate, full function, simulation models of complex devices. These complex devices, often called hardware modeling elements ("HMEs"), serve as their own models. An important, but often overlooked, aspect of the HMSs is the adapter to which the HME is attached that connects the HME to the pin electronics circuitry ("PEL") of the HMS.

The adapter, with a connected HME, of prior HMSs could not be connected to a PEL that was powered. It has been necessary to shut down the HMS before connecting the adapter. This was necessary for a variety of reasons as set forth below.

If the adapter had an electrostatic charge on it when its signal pins connected to the PEL, the discharge of the electrostatic charge to the internal PEL circuitry could damage the HMS and the HME. Another possible problem is that the signal ground of the PEL and adapter were not equalized before the pins of the two systems mated. If there were not equalization, the signal ground of the adapter could be floating, and the power supply voltages could couple through the HME or other components to signal lines, sending a damaging voltage level to the PEL. Still another possible problem is that upon mating of the adapter and PEL, the bulk capacitance on the adapter may cause a large in-rush current that could damage the PEL or adapter, and disrupt the operation of the HMS.

Prior adapters were not configured to support more than one specific pin-out configuration for an HME. If two HME pin-out configurations were different, generally, they could not be connected to the same adapter without modification.

Prior adapters did not have an on-board means to provide the HMS with information regarding the HME attached to the adapter. Nor were they readily alterable to change the configuration of the adapter circuitry to support special HME and HMS needs. Also, importantly, prior adapters were not configured so that external equipment could be attached for various uses with the HMS.

The present invention overcomes these and other problems, as fully demonstrated in the remainder of the specification and drawings.

SUMMARY OF THE INVENTION

The present invention is an improved system for, and method of, connecting HMEs to an HMS designed to model them. The system of the invention is embodied as a device adapter circuit board ("DAB"), to which the HME to be modeled is attached. The DAB, with a connected HME, is attached to the HMS.

The specification will refer to electronic components or circuitry that may include a group of components that carry out known functions. Those components or circuit elements that are known by those skilled in the art will be referred to generally by their common name or function, and will not be explained in detail.

The DAB includes circuitry, specific electronic components, and several physical structures. Each element of the DAB will now be discussed. The DAB system connector connects the DAB to the PEL of the HMS. The number of system connectors for a particular DAB depends on the number of HME signal pins the DAB supports. Because the system connector is the structure that connects the DAB to the PEL, most of the other DAB components and circuitry connect to the system connector, either directly or indirectly.

The DAB live insertion circuitry permits the DAB to be connected to, or removed from, the PEL of a powered HMS. To permit this, the live insertion circuitry provides a safe means for dissipating electrostatic charge, equalizing the signal ground between the DAB and PEL, and gradually powering the DAB and HME to prevent massive current in-rush.

The output of the DAB live insertion circuitry is input to the HMEVCC generation circuitry. This circuitry is capable of generating HMEVCC power supplies at different levels to match the VCC requirements of the HME connected to the DAB.

The output of the HMEVCC generation circuitry is input to a matrix of pads, to which the HME to be modeled connects. This structure includes not only the HMEVCC connection pads, but connection pads for signal ground, and connection pads for the various signal pins of the HME.

The matrix connection pads intended for connecting to the various HME signal pins are referred to as the HME footprint. The HME footprint is designed to support a number of pin-out configurations, such as a class or family of HMEs.

The HME footprint pads connect to the system connector through a configuration area. The lines that connect the HME footprint pads to the system connector pins come to the surface of the DAB at this area. This allows the DAB circuitry to be configured differently, for instance to cut and reconnect the signal lines, by the user, to accommodate special needs of the HME or HMS.

The DAB circuitry preferably includes a non-volatile memory device. The device, when directed, provides the PEL and HMS with information regarding the characteristics of the HME connected to the DAB and of the DAB itself. Among the information provided is the name of the HME, the shape of the HME footprint, and the number of system connectors on the DAB.

Certain circuitry of the HME may require periodic stimulation (refreshing) when the HME is not being used by the HMS for a period of time. Without being refreshed, this circuitry may drift or be permanently damaged. The DAB preferably includes a keepalive clocking circuit that connects to the clock pins of the HME to provide clock signals to the HME circuitry. The keepalive circuitry keeps the HME refreshed when it is not being accessed by the HMS.

The HMS will commence an evaluation sequence of the HME only after the HME has been initialized. The DAB feedback circuitry connects predetermined HME outputs to the PEL. When the feedback signal indicates that the HME has reached a predetermined state, the evaluation sequence will commence, if all other evaluative requirements are met.

The DAB analog sense circuitry connects the HME analog outputs to the PEL circuitry. The PEL processes the HME analog outputs for evaluation of certain operations of the HME.

The DAB presence detection circuitry indicates whether a DAB is plugged-in to the PEL, and indicates the DAB's particular location on the HMS. The DAB status indicators provide visual indications that the DAB is plugged-in and powered-up, and whether it is in use, i.e., whether the HME is being used by one or more simulations.

The DAB test points are used for synchronizing, for example, the operation of external test equipment with the operation of the HME. The test point signals may be used for marking the occurrence of events marking specific points in time when the HME is being evaluated. The DAB preferably has an area where additional circuitry or components may be connected to the DAB. The additional circuitry or components may be used to supplement the operation of different features of the DAB or to provide supplemental circuitry for the operation of the HME.

An object of the present invention is to provide a DAB for connecting an HME to the PEL of an HMS.

Another object of the present invention is to provide a DAB for connecting an HME to the PEL of an HMS that will allow the DAB with the attached HME to be connected to the PEL of a powered HMS.

A further object of the present invention is to provide a DAB for connecting an HME to the PEL of an HMS that has memory for identifying the HME, DAB, and their characteristics.

A yet further object of the present invention is to provide a DAB for connecting an HME to the PEL of an HMS that provides signals to the PEL to indicate that the DAB is present, and to indicate where it is connected.

A still further object of the present invention is to provide a DAB for connecting an HME to the PEL of an HMS that provides signals to the PEL to indicate when the HME has been initialized.

An object of the present invention is to provide a DAB for connecting an HME to the PEL of an HMS that has an HME connector (i.e., HME footprint and means of HME connection) to which a class or family of HMEs may be connected.

These and other objects of the invention will be described more fully in the remainder of the specification.

BRIEF DESCRIPTION OF THE DRAWINGS

FIG. 21 shows a representative HME footprint and footprint connection method for accommodating a class or family of plastic leaded chip carrier or quad flat-pack pin-out configurations.

FIG. 22 is a schematic drawing of the keep-alive clock circuitry of the DAB of the present invention.

FIG. 23 is a schematic drawing of the memory circuitry of the DAB of the present invention.

FIG. 24 is a schematic drawing of the indicator circuitry of the DAB of the present invention.

DETAILED DESCRIPTION OF THE DRAWINGS

Figure 1:
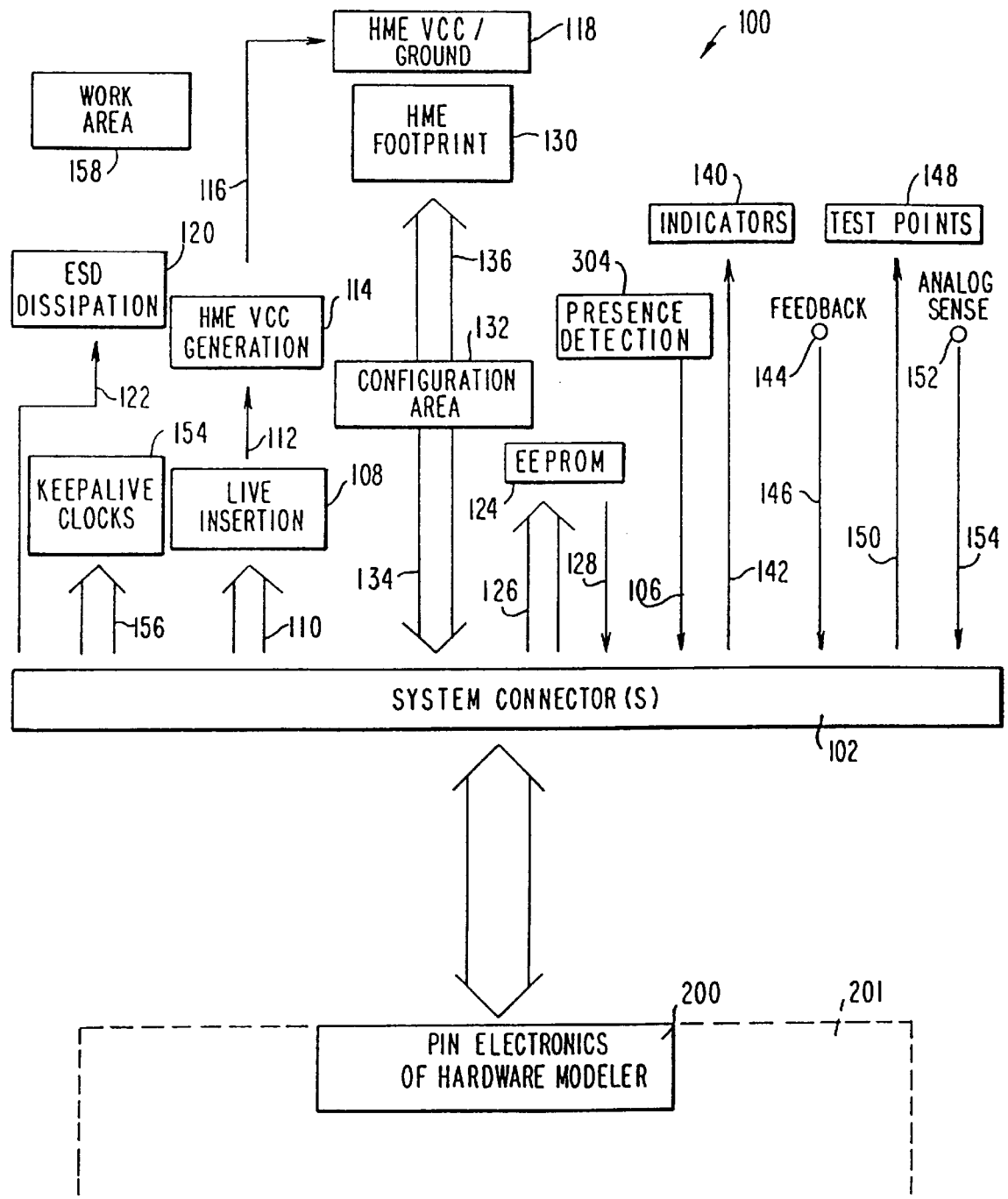
FIG. 1 is a block diagram of the DAB of the present invention.

FIG. 1 is a block diagram of DAB 100 of the present invention that is used to connect an HME (not shown) to PEL 200 of an HMS.

The DAB is the basic fixture for mounting an HME to the PEL. System connector 102 of the DAB is the structure that mates with PEL 200. The system connector is preferably a 130-pin connector. Eighty pins are signal pins. Some, but not all, of the remaining 50 pins are for connecting other signals between the DAB and the PEL.

The connection between DAB 100 and PEL 200 is represented by bi-directional signal connector 102. The pins of system connector 102 that mate with the appropriate section of PEL 200 preferably have the assignments shown in Table 1:

TABLE 1

| Signals | Direction | Description |
| --- | --- | --- |
| CLK10MHZ | From PEL | The two keep-alive |
| CLK1MHZ | to DAB | clock signals. |
| EECLK | From PEL to DAB | The clock to the DAB EEPROM |
| EEIN | From PEL to DAB | The serial input to the DAB EEPROM. |
| EEOUT | From DAB to PEL | The serial data output from the DAB EEPROM. |
| EESEL | From PEL to DAB | The select signal for the DAB EEPROM. |
| ESD GND | Common | The ground line that dissipates electrostatic charge from the DAB to the chassis ground of the HMS. The earliest mating connection pin of the system connector is associated with this signal. |
| FEEDBACK | From DAB to PEL | Signal to indicate that the HME is initialized. |
| HME ANALOG | From DAB to PEL | Analog signal from the HME sent to the PEL for measurement. |
| HME SIG | Bi-directional between DAB and PEL | Signals transmitted between the signal pins of the HME and the PEL. |

TABLE 1-continued

| Signals | Direction | Description |
| --- | --- | --- |
| HMEVCC | From DAB to HME and PEL | One or more signals generated in the DAB that are sent to the HMS for measurement, sent to power the HME, and sent to the PEL to be used as a reference and/or driver supply voltage. |
| INUSELED* | From PEL to DAB | Negative-true signal from the DAB to the in-use status LED. |
| KEEPALIVE* | From PEL to DAB | Negative-true signal that enables the keep-alive clock buffers. May also be used tb synchronize external test equipment. |
| PEL M12V | From PEL | The −12 V supply voltage. to DAB |
| PEL P12V | From PEL | The +12 V supply voltage. to DAB |
| PRESENT* | From DAB to PEL | Negative-true signal to indicate that the DAB is connected to the PEL. |
| SIG GND | Common | Signal ground. At least one signal ground connection pin of the system connector is associated with an early-mate pin. |
| USER | From PEL to DAB | One or more signals from the PEL for output from the DAB to external equipment for synchronization. |
| +5 PELVCC | From PEL. | The +5 V supply voltage. to DAB |
| −5.2 PELVCC | From PEL | The −5.2 V supply to DAB voltage. |

The "*" designation after a signal or signal name indicates the inverted state of the signal without the "*" designation, as is known by those skilled in the art.

The number of system connectors needed to support a particular HME is determined by the number of HME pins. As stated, each system connector has 80 signal pins intended for connection to HME pins. Preferably, up to four system connectors may be connected together as part of one DAB. Hence, a DAB may support HMEs that have up to 320 pins. When a DAB has more than one system connector, only the first system connector communicates with the PEL with respect to all of the signals indicated above. The remaining system connectors communicate only with respect to the HME SIG signals, the PRESENT* signal, HMEVCC signal, ground lines, and the power supply signals.

The remainder of the components and circuitry of the DAB will now be described.

Referring to FIGS. 1–6, live insertion of the DAB will be described. By "live insertion," it is meant that the DAB, with the attached HME, is connected to the PEL of a powered HMS.

Live insertion of the DAB involves the use of live insertion circuitry 108, the physical structure of system connector 102, and electrostatic charge dissipation ("ESD") circuitry 120. The combination of these circuitries and the structure permit the DAB to be live-inserted.

Live insertion preferably is performed in three phases: (1) electrostatic charge dissipation, (2) signal ground equalization, and (3) gradual power-up of the DAB and HME. The first two involve the ESD circuitry and the physical structure of the system connector, while the last is performed by live insertion circuitry 108.

System connector 102 and PEL 200 mate in a male/female relationship, with the system connector being the male fitting. The various pins of system connector 102 mate with the PEL over a period of time such that there are three classes of pins. Pins in the first class all mate before any pins in the second or third classes mate. Pins in the second class all mate before any pins in the third class mate. During removal (unmating), the order of mating is reversed, that is, pins in the third class unmate first, followed by pins in the second class, followed by pins in the first class. Pins in the first class are associated with electrostatic charge dissipation, while pins in the second class are associated with the signal ground equalization, and pins in the third class are associated with the remainder of the above-discussed signals transmitted between the DAB and PEL.

In the preferred embodiment, there is one pin on the system connector in each of the first and second classes, and the remaining pins fall into the third class. The sequence of mating is accomplished by using pins of three different lengths. As the DAB and PEL are mated, the longest pins mate earliest, and the differences between successive pin lengths allows for the physical (and therefore time) skew inherent in connector mating. Pins in the first class are 0.50 inches longer than pins in the third class. Pins in the second class are 0.25 inches longer than pins in the third class. Alternatively, the elongated pins may be part of the connector on the PEL.

With respect to electrostatic charge dissipation, the surface of the DAB can build up substantial amounts of electrostatic charge prior to connection to the PEL. This charge must be leaked off before the DAB signal pins mate with the pins of a powered PEL. This electrostatic charge may reach as much as 15 KV. If it is not leaked off before general mating takes place, the discharge of the electrostatic charge to the PEL circuitry may cause considerable damage to the PEL, the HME, and to the HMS in general.

Figure 2:
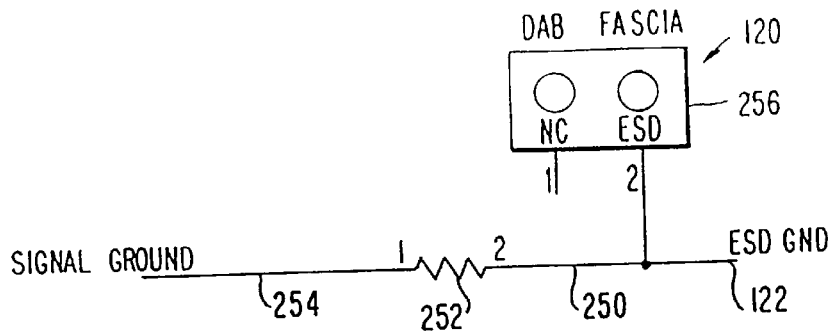
FIG. 2 is schematic drawing of the electrostatic dissipation circuitry of the DAB of the present invention.

Referring to FIGS. 1 and 2, electrostatic change dissipation will be described. ESD GND line 122 connects to the longest pin of system connector 102. The ESD GND line also connects to DAB fascia 256. As system connector 102 mates with the female connector of PEL 200, the earliest-mating pin of the system connector connects to chassis ground through the fascia of the PEL. When the earliest-mating pin makes contact, the electrostatic charge on the DAB fascia is dissipated to ESD GND line 122, which is the chassis ground of the HMS.

ESD GND line 122 also connects to SIG GND line 254 through resistor 252. This provides a leakage path between SIG GND line 254 and chassis ground, therefore preventing any significant voltage potential from developing on chassis ground with respect to signal ground. Resistor 252 is very large. In the preferred embodiment, it is 1M ohm.

After the DAB is mated to the PEL, it must still be able to dissipate electrostatic charge. This protects the DAB if, for example, an operator touches the DAB when he or she is carrying electrostatic charge. The DAB fascia has a spring connected to it that is biased against sheet metal (chassis ground) of the HMS when the DAB is connected. This arrangement directly dissipates electrostatic charge which has been imparted to the DAB fascia to chassis ground.

With respect to signal ground equalization, the signal grounds of the DAB and PEL may not be at the same level before they are mated. Without first equalizing this potential difference, and maintaining a consistent signal ground connection between the PEL and DAB through the remainder of the mating process, other power supply voltages could couple through the HME or other components to the DAB signal ground, and then through the HME or other components to signal lines, sending a damaging voltage level to the PEL. Signal ground equalization occurs after electrostatic charge dissipation, but before the mating of the remainder of the DAB system connector pins with the PEL.

The early-mating signal ground pin (of the second class of system connector pins) fulfills this requirement. When the PEL and DAB mate and electrostatic charge has been dissipated, SIG GND line 254, which is connected to the early-mate signal ground pin, contacts the pin on the PEL connector to which signal ground is connected before any of the remaining signals on the DAB system connector mate to the PEL. Once the early-mate signal ground mates, the PEL and DAB signal grounds are equalized essentially instantaneously.

Following equalization of the signal grounds, the DAB signal pins mate with the female connector of the PEL. When the two mate, the various voltage supplies are supplied to the DAB to power the DAB and the HME. Without some type of protection at mating, the bulk capacitance of the DAB and HME circuitry would draw instantaneous current, causing a massive current in-rush to the DAB and HME, and serious voltage depletions in the PEL and HMS in general. The result of this could be uncontrolled transients in the system, components changing state, and damage to the HME, PEL, and HMS. To prevent this massive current in-rush, the DAB ramps-up the supply voltages in a manner that will now be described.

The mating skew among all the pins in the third class when the DAB system connector and female PEL connector mate is approximately 10 milliseconds. The live insertion circuitry turns on the power supplies in a period equal to or greater than this skew. This roughly emulates the behavior of the typical DC switching power supply used in electronic systems, in which multiple supplies turn on and ramp up at approximately the same time. As with the typical switching power supply, the particular sequencing of supply turn-on is not specified or guaranteed.

At mating, the PEL provides four power supply voltages to the DAB. These are input to live insertion circuitry 108 via bus 110. The four voltages are +5 V, −5.2 V, +12 V, and −12 V. The circuitry to ramp-up these power supplies will now be described.

Figure 3:
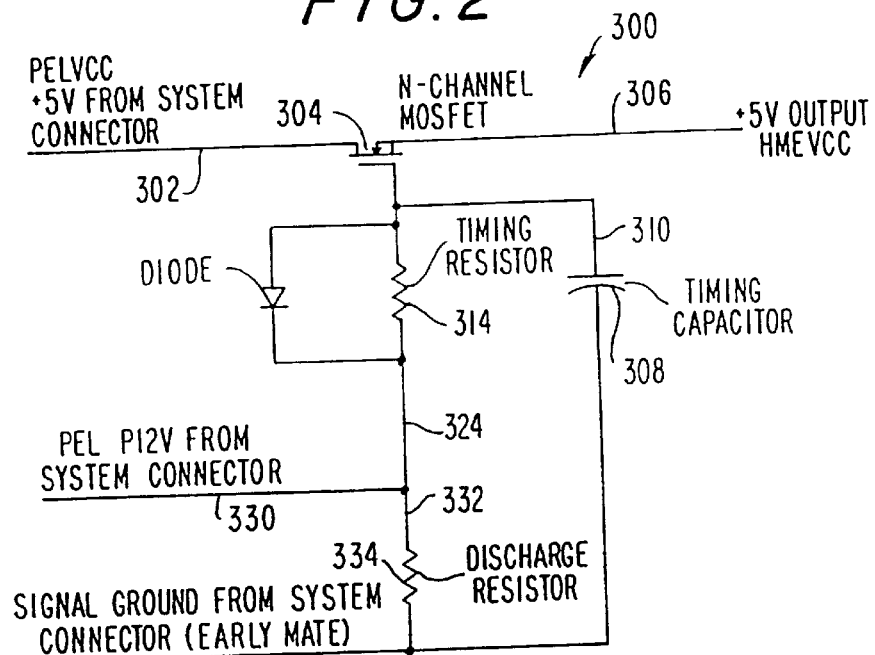
FIG. 3 is a schematic drawing of the live insertion circuitry of the DAB of the present invention associated with the +5 V supply voltage.

Referring to FIG. 3, the circuitry to ramp-up the +5 V PELVCC signal on line 302 is generally shown at 300. The +5 V PELVCC signal on line 302 is input to N-channel MOSFET 304. The gate of the MOSFET is connected to a timing circuit that ramps-up the +5 V PELVCC signal at the output of the MOSFET on line 306. The +5 V live insertion circuitry includes the +12 V supply voltage signal PEL P12V on line 330, which is input to line 324 of the timing circuit. Diode 318 and timing resistor 314 are connected in parallel in line 324, and the end of line 324 connects to the gate of MOSFET 304. Line 310 connects between the gate of MOSFET 304 and SIG GND line 254. Timing capacitor 308 is connected in line 310.

Line 332 is connected in parallel with lines 324 and 310 (taken together) between the +12 V supply voltage and SIG GND line 254. Discharge resistor 334 is disposed in this line. Timing resistor 314 has a much higher value than discharge resistor 334. This relationship ensures that the time constant of the timing capacitor and discharge resistor is much less than the time constant of the timing capacitor and the timing resistor.

As the DAB and PEL are mated, the contacts of the connectors bounce. During bouncing, when the PEL P12V signal on line 330 is connected, timing capacitor 308 charges to +12 V through timing resistor 314. When PEL P12V is disconnected, the timing capacitor 308 discharges through diode 318 and discharge resistor 334. Over the period of bouncing, that the time constant of the discharge circuit is very short compared to that of the timing circuit, and that the timing circuit time constant is comparable to the expected length of the bouncing period, ensures that the timing capacitor will not fully charge until the connectors are fully mated. When, however, the DAB and PEL have been fully mated on the order of the time constant of the timing resistor 314 and timing capacitor 308, and the PEL P12V signal has stabilized, the gate voltage of the MOSFET will approach +12 V. This turns on the MOSFET and ramps-up the +5 V HMEVCC signal at the output of the MOSFET on line 306. The ramp-up of the +5 V supply voltage takes place in the threshold region of the MOSFET (i.e., the gate voltage compared to +5 V), and the slope of the ramp depends on the current demand.

Figure 4:
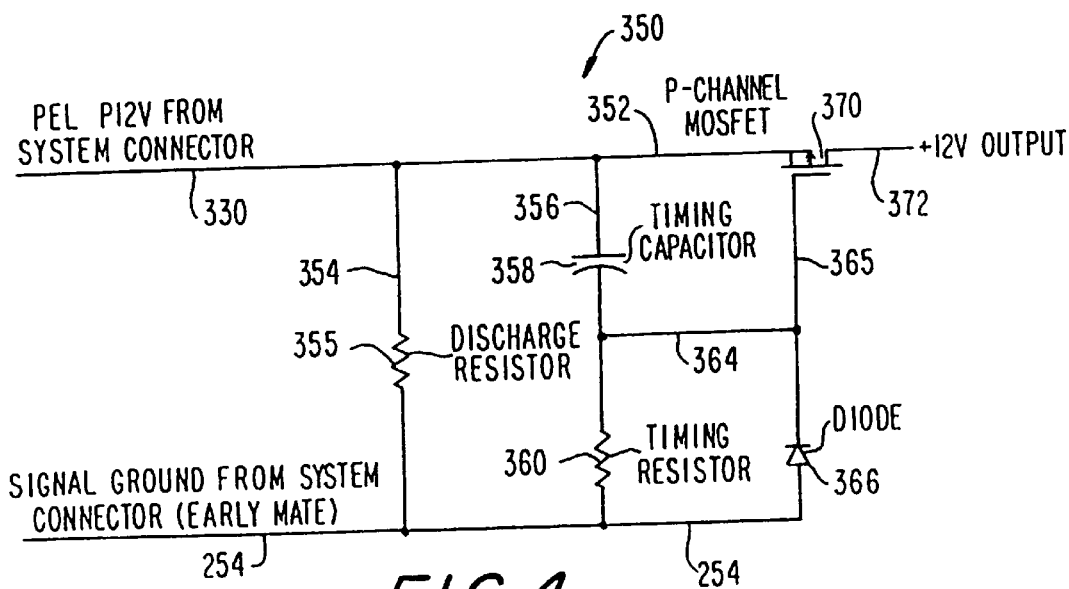
FIG. 4 is a schematic drawing of the live insertion circuitry of the DAB of the present invention associated with the +12 V supply voltage.

The live insertion circuitry for the +12 V supply voltage is shown in FIG. 4 at 350. The +12 V supply voltage is input to the live insertion circuitry as the PEL P12V signal on line 330. This signal is input to P-channel MOSFET 370. The gate of MOSFET 370, like the gate of MOSFET 304 of the +5 V live insertion circuitry, is connected to a timing circuit.

The timing circuit uses the supply voltage, not a separate voltage, to initiate its actions. Line 354 of the timing circuit, with discharge resistor 355, is connected in parallel with line 356. Line 356 includes a timing capacitor 358 connected in series with the parallel combination of timing resistor 360 and diode 366. Line 364 connects diode 366 and timing resistor 360. Line 365 connects line 364 to the gate of MOSFET 370. SIG GND line 254 connects to the return side of the timing circuit. The value of the discharge resistor is much less than that of the timing resistor, for the same reason as set forth for the +5 V live insertion circuitry. That is, the time constant of the discharge resistor and the timing capacitor is much less than the time constant of the timing resistor and the timing capacitor.

As stated, during mating of system connector 102 and the female connector of the PEL, signal bouncing occurs. During bouncing, timing capacitor 358 and timing resistor 360 act as a differentiator, bringing the signal at the gate of the MOSFET up to +12 V or more when PEL P12V makes contact. When contact is lost, timing capacitor 358 rapidly discharges through diode 366 and discharge resistor 355, the gate voltage returns to the same as PEL P12V, and the MOSFET 370 remains turned off.

When the DAB and PEL have been fully mated on the order of the time constant of timing resistor 360 and timing capacitor 358, the voltage at the gate of the P-channel MOSFET approaches 0 V. As this takes place, the output of MOSFET 370 on line 372 will ramp-up to +12 V. As stated, the ramp-up of the MOSFET output is over the threshold region (i.e., the gate voltage compared to +12 V), and the slope of the ramp is dependent on the current demand.

The remaining two live insertion circuits are associated with the −5.2 V and −12 V supply voltages. These circuits are similar to the circuit disclosed for the +12 V supply voltage, except that their MOSFETs are N-channel rather than P-channel devices. Because of this, the diode is reversed in the −5.2 V and −12 V timing circuits. Since the −5.2 V and −12 V circuits are the same, the −5.2 V circuit shown in FIG. 5 will be described, and the reference numbers of the −12 V circuit (shown in FIG. 6) will follow in parenthesis.

Figure 5:
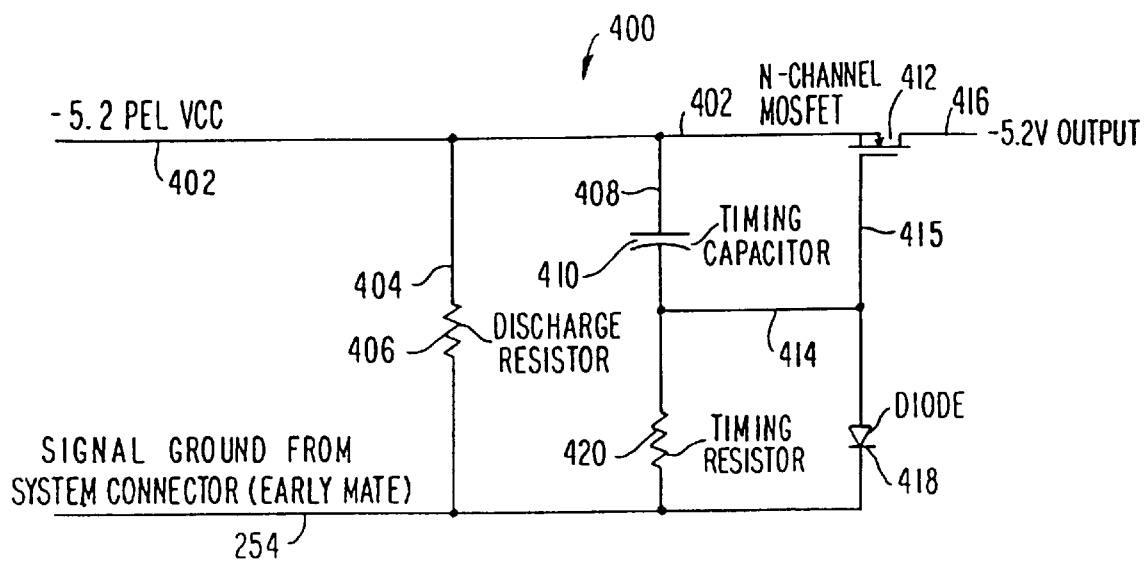
FIG. 5 is a schematic drawing of the live insertion circuitry of the DAB of the present invention associated with the −5.2 V supply voltage.
Figure 6:
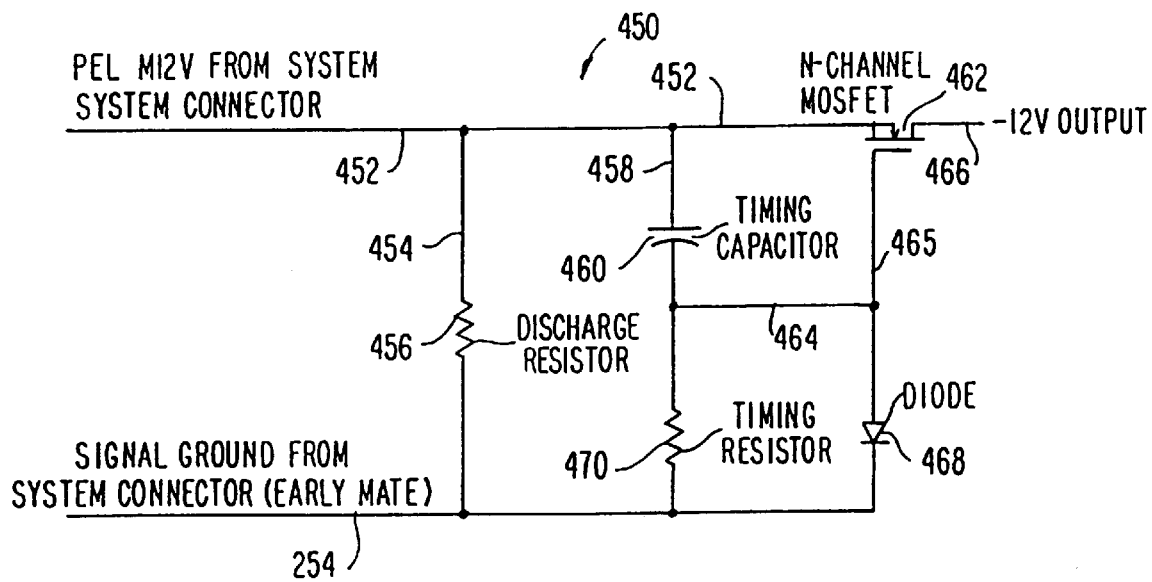
FIG. 6 is a schematic drawing of the live insertion circuitry of the DAB of the present invention associated with the −12 V supply voltage.

Referring to FIG. 5 (FIG. 6), the live insertion circuitry for the −5.2 V (−12 V) supply voltage is shown generally at 400 (450). The −5.2 V (−12 V) supply voltage is input to the live insertion circuitry as the −5.2 PELVCC (PEL M12V) signal on line 402 (452). This signal is input to the source of N-channel MOSFET 412 (462). The gate of the MOSFET, like the gate of the MOSFET associated with the +5 V live insertion circuitry, is connected to a timing circuit.

The timing circuit has line 404 (454) with discharge resistor 406 (456) connected in parallel with line 408 (458). Line 408 includes timing capacitor 410 (460) connected in series with the parallel combination of timing resistor 420 (470) and diode 418 (468). Line 414 (464) connects the diode and timing resistor. Line 415 (465) connects line 414 (464) to the gate of MOSFET 412 (462). SIG GND signal line 254 connects to the return side of the timing circuit. The value of the discharge resistor is much less than that of the timing resistor for the same reason set forth for the previous circuits. That is, the time constant of the discharge resistor and the timing capacitor is much less than the time constant of the timing resistor and the timing capacitor.

During bouncing, timing capacitor 410 (460) and timing resistor 420 (470) act as a differentiator, bringing the signal at the gate of the MOSFET down to −5.2 V (−12 V) or less when −5.2 V PELVCC (PEL M12V) makes contact. When contact is lost, timing capacitor 410 (460) rapidly discharges through diode 418 (468) and discharge resistor 406 (456), the gate voltage returns to the same as −5.2 V PELVCC (PEL M12V), and the MOSFET 412 (462) remains turned off.

When the DAB and PEL have been fully mated on the order of the time constant of the timing resistor 420 (470) and timing capacitor 410 (460), the voltage at the gate of the N-channel MOSFET 412 (462) approaches 0 V. The ramp-down of the −5.2 V (−12 V) supply voltage output on line 416 (466) takes place in the threshhold region of the MOSFET, i.e. the gate voltage compared to −5.2 V (−12 V), and the slope of the ramp depends on the current demand.

Figure 7:
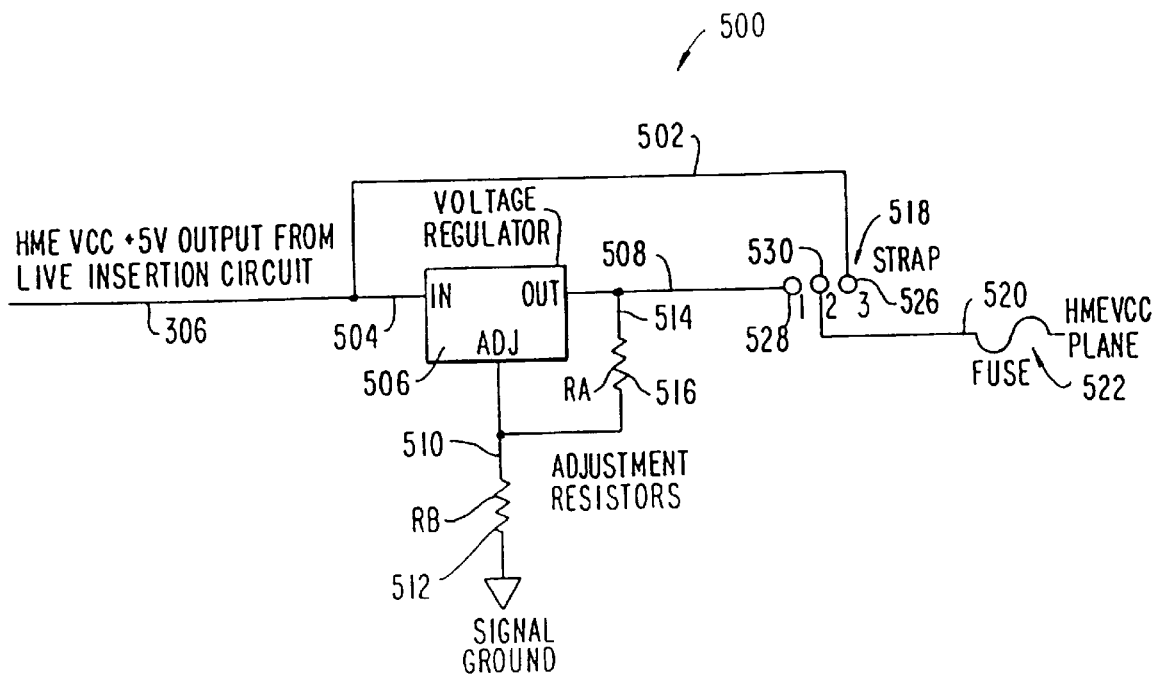
FIG. 7 is a schematic drawing of the EMVCC generation circuitry of the DAB of the present invention.

Referring to FIG. 7, the HMEVCC generation circuitry will be described. The HMEVCC generation circuitry is shown generally at 500. For convenience, it is assumed that the +5 V HMEVCC signal on line 306 is input to HMEVCC generation circuitry 500 instead of one of the other supply voltages. However, it is understood that the input signal could also be one of the other supply voltages, −5.2 V, +12 V, or −12 V.

The HMEVCC signal on line 306 connects to lines 502 and 504. Line 502 connects to terminal 526 of switch 518. Line 504 connects to the input of voltage regulator 506. Regulator 506 is commercially available from Linear Technology, under model number LT1085. The output of voltage regulator 506 is connected to terminal 528 of switch 518.

The output voltage of the regulator is adjusted by the resistor network connected to its adjustment input. Line 510, with resistor 512 disposed in it, is connected between the adjustment input and signal ground. Line 514, with resistor 516 disposed in it, is connected to line 508 at the output of voltage regulator 506. The values of these resistors are chosen to provide an output voltage that will match the voltage required for the HME. Table 2 shows the relationship of the resistors and the regulator output voltages. The RA and RB values correspond to resistors 516 and 512, respectively.

TABLE 2

| VREG  | RA Value (ohms) | RB value (ohms) |
|-------|-----------------|-----------------|
| 3.5V  | 100             | 180             |
| 3.3V  | 91              | 150             |
| 3.2V  | 43              | 68              |
| 3.0V  | 47              | 68              |
| 2.9V  | 91              | 120             |
| 2.8V  | 120             | 150             |
| 2.5V  | 91              | 91              |
| 2.4V  | 100             | 91              |
| 2.2V  | 120             | 91              |
| 2.0V  | 91              | 56              |
| 1.8V  | 75              | 33              |
| 1.5V  | 120             | 27              |

Assuming, for descriptive purposes only, that the voltage output on line 508 of the voltage regulator is 3.3 V, switch 518 has 3.3 V at terminal 528 and 5 v at terminal 526. Depending on the specific HME connected to the DAB, one of these will be selected for output from the switch on line 520 via terminal 530.

Fuse 522 is disposed in line 520 to protect the HME and HMS should there be a short from HMEVCC to another supply voltage or ground. The signal output from the HMEVCC generation circuitry is the HMEVCC that is input to the HME connector, and is returned to the PEL for use as a reference voltage and/or driver supply voltage.

Figure 8:
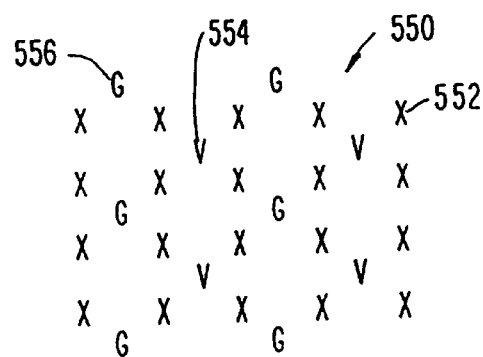
FIG. 8 shows a representative portion of the HME connector.

The HME connector includes the HME footprint, the HMEVCC connections, and signal ground connections. A representative portion of the HME connector for a pin-grid array HME footprint is diagrammed in FIG. 8 at 550. In FIG. 8, "X" sites 552 are the HME footprint pads that receive the pins of the HME, "V" sites 554 are the HMEVCC pads, and "G" sites 556 are the signal ground pads. Since the HME "X" sites are arranged on 0.1 inch centers, the maximum distance from any "X" site to either a "V" or "G" site is 0.71 inches. Hence, when the pins of the HME are connected to the "X" sites, any pins that are signal ground pins or voltage supply pins can be easily connected to a "G" or "V" site, respectively.

It is understood that the relationship of the "X," "V," and "G" sites for the various types of HME packaging will be different, and that these other relationships are within the scope of the present invention.

FIGS. 9–19 refer to HME footprints and methods of connecting footprint pads. The HME footprint of the present invention will accommodate HME pin-out configurations of a class or family of HMEs. Four specific classes or families of HMEs with a variety of pin-out configurations accommodated by the HME footprint method of the present invention are HMEs with pin grid array ("PGA") pin-out package configurations, dual in-line ("DIP") pin-out package configurations, plastic leaded chip carrier ("PLCC") pin-out package configurations, and quad flat-pack ("QFP") pin-out package configurations. However, it is understood that the method of HME footprint construction and pad connection disclosed herein is equally applicable to other pin-out configuration types. In the following, the PGA, the DIP, the PLCC, and then the QFP footprints of the present invention will be described.

The pins of HMEs with a PGA pin-out configuration are generally arranged in concentric rectangular rings. The matrix of the connection pads of the HME connector are arranged in the same manner. One HME footprint that supports HMEs with PGA pin-out configurations has a 20-by-20 matrix of connection pads, with 0.1 inch centers in both directions. Each of these pads may be connected to a separate pin of system connector 102, however, it is not a requirement that each pad do so. Therefore, this HME footprint could, at a maximum, support HMEs with up to 400 pins.

In the preferred embodiment, up to four system connectors may be used with one DAB, and each system connector has 80 signal pins for connection to the HME. Hence, the largest DAB would support a 320-pin HME. However, it is understood that system connectors with a greater number of signal pins or a greater number of system connectors are within the scope of the present invention to support the 400 pad HME footprint or even larger HME footprints.

The preferred embodiment of the HME footprint has a 20-by-20 matrix (or 400 pads). For purposes of illustration, the HME to be connected to the DAB has 240 pins. Since each system connector has 80 HME signal pins, three system connectors are required to support this HME.

The following is a description of the HME footprint pad connection to support a class or family of PGA pin-out configurations having 240 pins or less.

The following criteria are important to the connection of the pads of the matrix: (1) the total number of pads of the footprint can exceed the total number of signals from system connector 102; (2) each of the 240 data pins of the three system connectors are first routed to one pad of the 400 pad footprint; (3) two or more connection pads may be connected to the same system connector pin, as long as two HME pins (footprint pads) are not connected together when the HME is plugged into the footprint; and (4) PGA pin-out configurations generally start with the largest possible complete rectangular range and work inwardly, forming successively smaller concentric rectangular rings, and if the innermost ring is not complete, corner and center position of the innermost ring are most commonly selected for the placement of pins.

Figure 9:
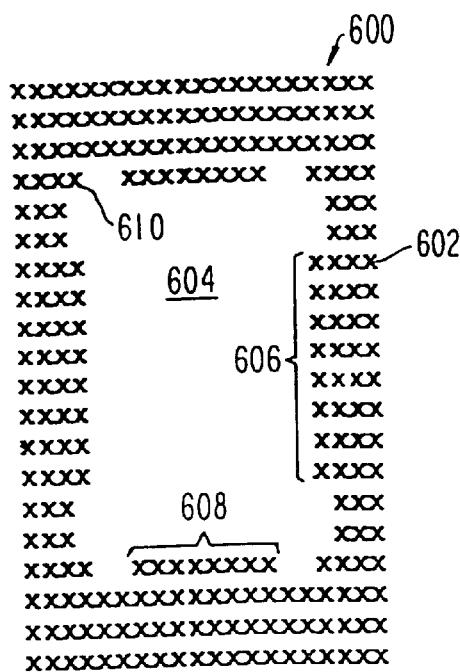
FIGS. 9 through 19 show representative HME footprints and footprint connection methods for accommodating a class or family of pin grid array pin-out configurations.

Following this criteria, connection of an HME footprint to the system connectors for a 240 pin HME will be described. FIG. 9, at 600, shows the initial set of pads to which the 240 pins of the three system connectors are connected. "X" sites 602 represent the pads of the footprint. The pads are individually connected to each of the 240 available HME signal lines on the system connectors starting with the outermost concentric ring, with 20 pads at each side, and working inward until all 240 pads are connected. It is to be noted that the innermost ring is partially complete, and as specified, "X" sites 610 at the corners and the "X" sites at the centers 606 and 608 are connected, rather than other positions. The remainder of the figures, FIGS. 10–19, describe the connections to accommodate fixturing of PGA pin-out HMEs with, at most, 240 pins, and with, at most, a 20-by-20 outermost rectangular ring of pins. In each of the figures, the center at 604 includes HME footprint pads which are either unconnected or which may be connected in a subsequent step of this procedure to system connector HME signal lines that have already been assigned.

Figure 10:
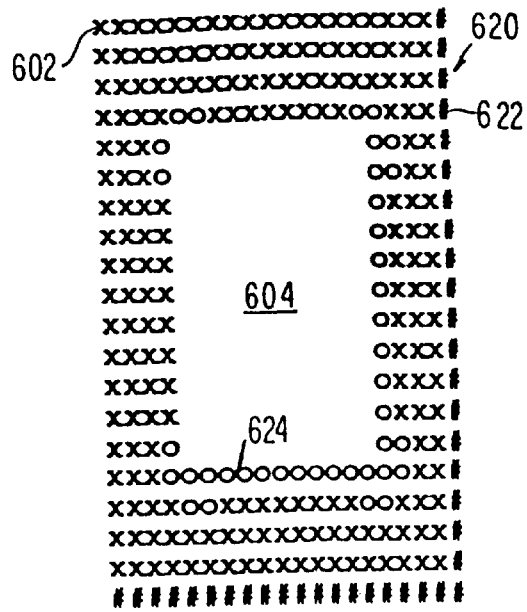
Figure 11:
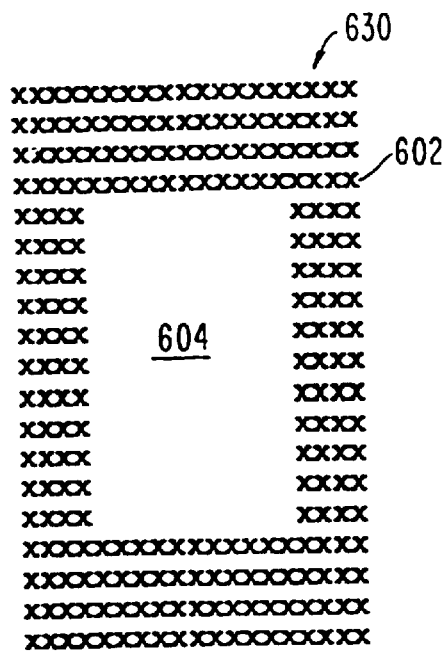

FIG. 10 at 620 shows how the original 20-by-20 rectangular ring of pins is treated to produce a new HME footprint with a 19-by-19 rectangular ring of pins. Two adjacent sides of the outermost ring, designated by "#" sites 622, represent the 39 HME footprint pads which are not required in the 19-by-19 HME footprint. The 39 "0" sites 624 are those HME footprint pads which are filled in to the previous 20-by-20 HME footprint to form an optimal 19-by-19 240-pin HME footprint. By optimal, it is meant that the criteria for filling concentric rings and then assigning remaining pins to corner and middle positions are met. The 39 "#" sites 622 are pairwise connected with the 39 "0" sites 624. Thus, each "0" site shares one system connector pin with a corresponding "#" site. FIG. 11 shows the resulting 19-by-19 HME footprint.

This process of connecting the footprint pads is followed in the sequence of the HME footprint arrangements shown in FIGS. 12 to 19, as will be described.

Figure 12:
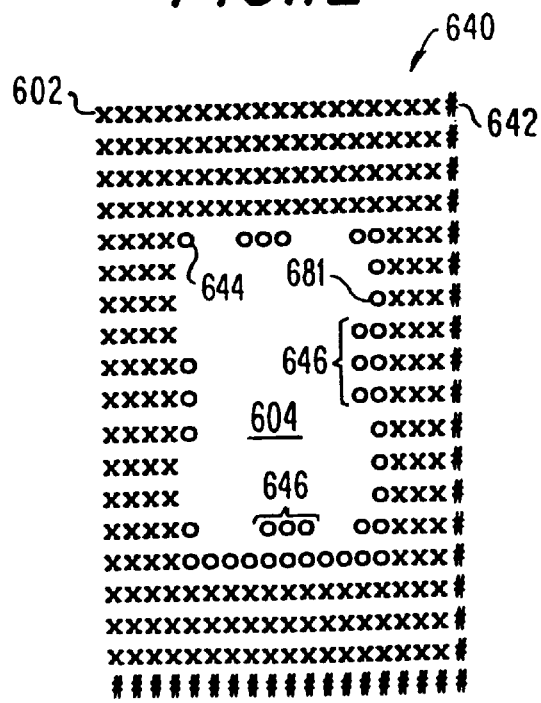
Figure 13:
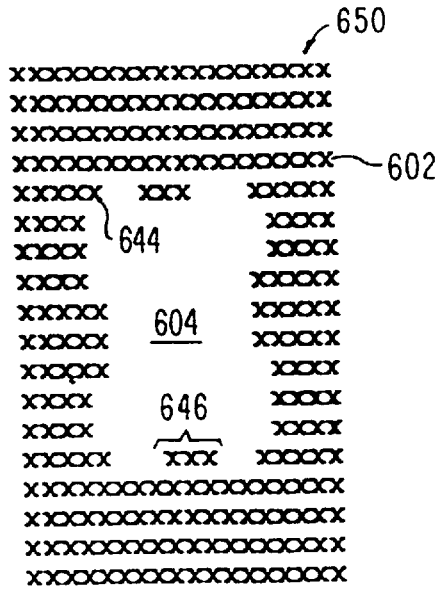

FIG. 12 at 640 shows how the 19-by-19 HME footprint is treated to produce a new HME footprint with a 18-by-18 rectangular ring of pins. Two adjacent sides of the outermost ring, designated by "#" sites 642, represent the 37 HME footprint pads which are not required in the 18-by-18 HME footprint. The 37 "0" sites 641 are those HME footprint pads which are filled in to form an optimal 18-by-18 240-pin HME footprint, where optimal is as previously defined. The 37 "#" sites 642 are pairwise connected with the 37 "0" sites 641. Thus, each "0" site shares one system connector pin with a corresponding "#" site. FIG. 13 shows the resulting 18-by-18 HME footprint.

Figure 14:
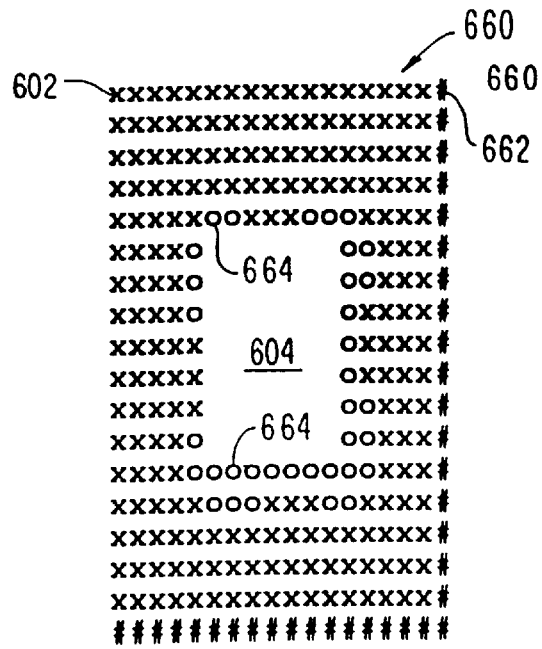
Figure 15:
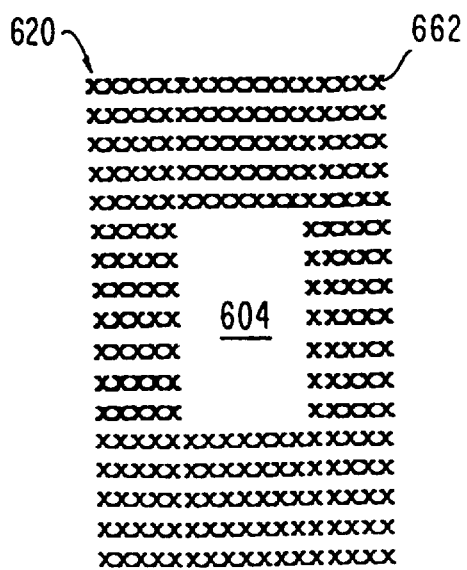

FIG. 14 at 660 shows how the 18-by-18 HME footprint is treated to produce a new HME footprint with a 17-by-17 rectangular ring of pins. Two adjacent sides of the outermost ring, designated by "#" sites 662, represent the 35 HME footprint pads which are not required in the 17-by-17 HME footprint. The 35 "0" sites 664 are those HME footprint pads which are filled in to form an optimal 17-by-17 240-pin HME footprint, where optimal is defined as previously. The 35 "#" sites 662 are pairwise connected with the 35 "0" sites 664. Thus, each "0" site shares one system connector pin with a corresponding "#" site. FIG. 15 shows the resulting 17-by-17 HME footprint.

Figure 16:
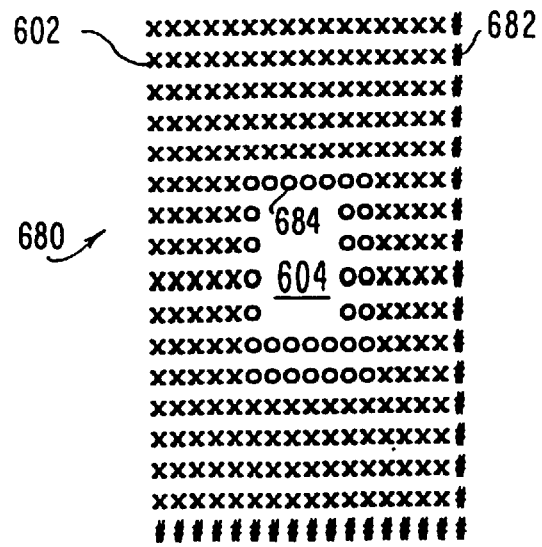
Figure 17:
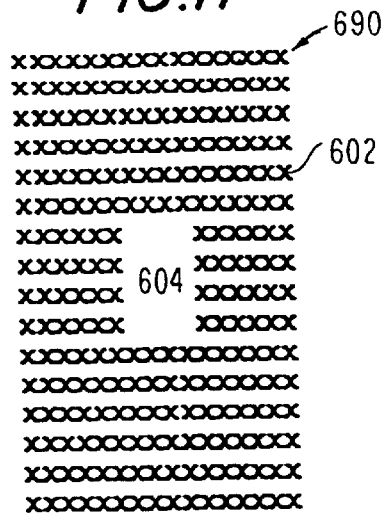
Figure 18:
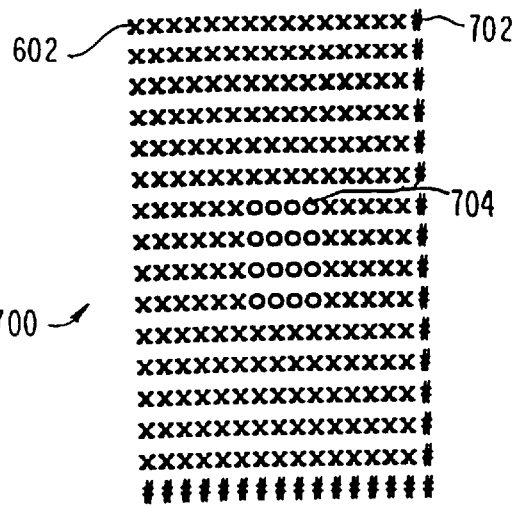

FIG. 16 at 680 shows how the 17-by-17 HME footprint is treated to produce a new HME footprint with a 16-by-16 rectangular ring of pins. Two adjacent sides of the outermost ring, designated by "#" sites 682, represent the 33 HME footprint pads which are not required in the 16-by-16 HME footprint. The 33 "0" sites 684 are those HME footprint pads which are filled in to form an optimal 16-by-16 240-pin HME footprint, where optimal is as previously defined. The 33 "#" sites 682 are pairwise connected with the 33 "0" sites 684. Thus, each "0" site shares one system connector pin with a corresponding "#" site. FIG. 18 shows the resulting 16-by-16 HME footprint.

FIG. 18 at 700 show how the 16-by-16 HME footprint is treated to produce a new HME footprint with a 15-by-15 rectangular ring of pins. Two adjacent sides of the outermost ring, designated by "#" sites 702, represent the 31 HME footprint pads which are not required in the 15-by-15 HME footprint. The 16 "0" sites 704 are those HME footprint pads which are filled in to form an optimal 15-by-15 240-pin HME footprint, where optimal is as previously defined. Note that, in this case, there are more available "#" sites than required "0" sites. Only 16 of the "#" sites are then required to connect to the "0" sites and therefore share the same system connector pins. The remaining 15 "#" sites have no further connections.

Figure 19:
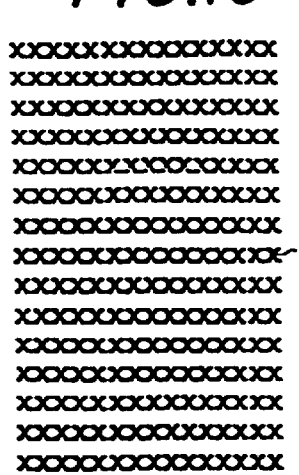

The center portion that was present in the previous footprints is now completely connected to system connector 102. FIG. 19 at 720 shows the resulting footprint as it is presented to a 15-by-15 HME. Any HME with a PGA pin-out equal to or smaller than 15-by-15 can be plugged into this HME footprint.

The result of the application of this method is that any HME whose pin-out configuration is a subset of that shown in FIGS. 9, 11, 13, 15, 17, or 19, is properly supported by the DAB whose HME footprint has been constructed as just described.

This method of connecting the pads of the HME footprint is also applicable if the DABs has one, two, or four system connectors that accommodate HMEs with PGAs with up to 80, 160, or 320 pins, respectively, or indeed, with any size of HME footprint and corresponding system connector pins.

Figure 20:
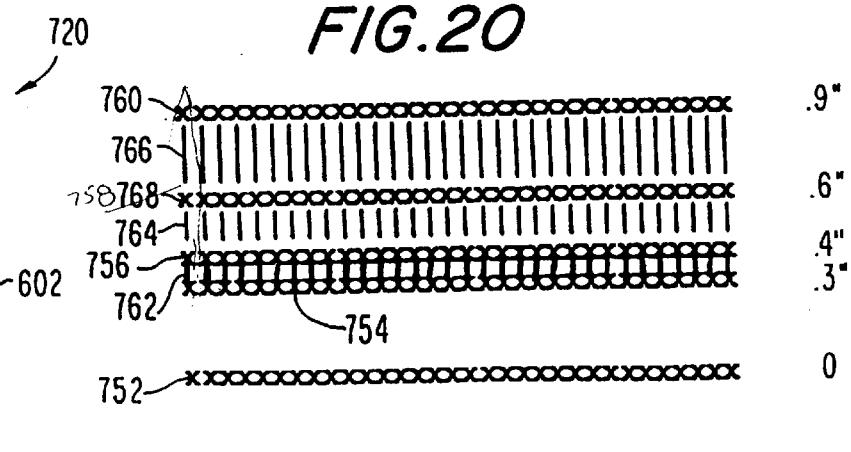
FIG. 20 shows a representative HME footprint and footprint connection method for accommodating a class or family of dual in-line packaging pin-out configurations.

FIG. 20 at 750 shows the HME footprint for HMEs with DIP pin-out arrangements. This footprint has base row 752, and rows 754, 756, 758, and 760 spaced from the base row 0.3, 0.4, 0.6, and 0.9 inches, respectively. The footprint will accommodate DIP pin-out arrangements with different widths having up to 64 pins.

All of the rows, except the base row, are connected in parallel. Specifically, parallel connections 762 connect rows 754 and 756, parallel connections 764 connect rows 756 and 758, and parallel connections 766 connect rows 758 and 760. In connecting the system connector to the footprint connection pads, 32 pins of the system connector connect to the base row and 32 other pins connect to the 32 parallel connected columns formed by the rows at 0.3, 0.4, 0.6, and 0.9 inches from the base row.

This method of connecting the pads of the HME footprint is also applicable for other sizes and spacings of DIP pin-out arrangements. The parallel connection method for use with DIP pin-out arrangements also applies to HMEs with plastic leaded chip carrier ("PLCC") pin-out arrangements.

Referring to FIG. 21, the HME footprint diagrammed at 800 supports a 28 pin PLCC, and can be extended to support larger or smaller PLCCs in the following manner. "X" sites 802, "1" sites 804, and "#" sites 806 are the initial footprint pads, and together total 28 footprint connection pads. To support, for example, a 20 pin PLCC, "#" sites 806 are connected to "2" sites 808. In a like manner, there can be other footprint connection pads connected in parallel for PLCC pin-out arrangements with more than 28 pins and less than 20 pins.

By employing different pad shapes and spacing, but using the general method described above for supporting PLCC HME footprints, HMEs with QFP pin-out arrangments can also be supported. Referring to FIG. 21, the HME footprint diagrammed at 800 supports a 28-pin QFP and can be extended to support larger and smaller QFPs, as similarly described for PLCCs.

Referring to FIG. 1, HME footprint 130 is connected to system connector 102 by bi-directional connection lines 134 and 136 which pass through configuration area 132. Connection lines 134 and 136, referred to as "traces", may use internal signal layers in the DAB but come to the surface at the configuration area.

The purpose of configuration area 132 is to provide an area where lines between the HME and the PEL can be altered to prevent problems or to implement special features. The following are some uses of the configuration area, but it is to be understood that there may be others which would be within the scope of the invention.

A first representative situation in which a line would be cut at configuration area 132 is when the HME requires a power supply that is outside the range of the PEL protection circuitry. Such a voltage could damage the HMS and PEL circuitry. Therefore, the line connecting to this power supply pin on the HME is cut and left unconnected at the configuration area.

A second representative situation which dictates that the line be cut at configuration area 132 is to include additional circuitry or components in the line between the HME and the PEL. This could be, for example, the implementation of a level translator. This implementation may be necessary if either the PEL is driving at a level that is different from the input levels of the HME, or the HME is driving at a level that is different from the input levels of the PEL. The additional circuitry or components, such as the level translator, may be positioned in work area 158 which will be subsequently described.

A third representative example that requires a line to be cut at configuration area 132 is when the load of the line on an analog input or output of the HME could cause disruption of operation of the HME.

A fourth situation that requires a line to be cut at configuration area 132 is to permit the DAB to support previously unconnected HME pins. This may be necessary when the HME has more pins than HME signal pins in the system connector. In this case, one of the plurality of lines connecting to pins on the HME associated with HMEVCC, signal ground, or an unused (no-connect) pin is cut, and the system connector side of the line is connected to the previously unconnected pin.

Work area 158, briefly mentioned above, is an area where additional circuitry or components may be connected to the DAB. The work area is an array of pads which are not electrically connected to any supply, ground, or other signals. Alternating HMEVCC and signal ground pads preferably surround the work area for connection to the circuitry or components connected to the work area. Representative examples of the circuitry or components that may be connected to the work area include special feedback logic to decode particular HME states into single rising or falling edges, level translators to match input and output levels of the HME and PEL, analog support circuitry for the HME, and special HME clock drivers.

During HMS operation, there are periods when a particular HME is not being accessed by the HMS. Some HME components, however, require refreshing during such idle periods. If they are not refreshed, the certain circuitry within the HME may drift, requiring it to warm-up and restabilize before it can be evaluated again, or resulting in permanent damage to the HME.

FIG. 22, generally at 850, shows keepalive clock circuitry 154 of FIG. 1. Referring to FIGS. 1 and 22, system connector 102 receives two keepalive clock signals and an enable signal from the PEL. The system connector provides these signals to the keepalive clock circuitry via parallel input 156 (FIG. 1). As shown in FIG. 22, the input signals are the CLK10 MHz signal on line 852, the CLK1 MHz signal on line 856, and the KEEPALIVE* signal of line 868. The CLK10 MHz and CLK1 MHz signals are input to the data inputs to buffer 860. The KEEPALIVE* signal is input to the negative-true output enable input to the buffer. When the KEEPALIVE* signal has a logic low value, the CLK10 MHz and CLK1 MHz signals are output from buffer 860 as the BUF CLK10 MHz and BUF CLK1 MHz signals on lines 854 and 858, respectively. The BUF CLK10 MHz or BUF CLK1 MHz signals can be connected to clock pins of the HME. The PEL drives the KEEPALIVE* signal to a logic low value a predetermined time after the end of the last HMS access until the next HMS access.

Referring to FIGS. 1 and 23, the DAB includes electrically-eraseable programmable read-only memory (EEPROM) 124. Preferably, EEPROM 124 is model NMC9346 manufactured by National Semiconductor. The information that may be stored in EEPROM 124 includes the manufacturer of the HME, the device designation of the HME, the manufacturer and revision of the DAB, the revision of the associated software, the number of system connectors, the number of supported pins, the type of HME footprint, the type and size of DAB, and other information useful for the proper operation of the HMS.

EEPROM 124 and the signals associated with it are shown in FIG. 23 at 900. The EESEL signal on line 904 is input to the chip select input ("CS"), the EECLK signal on line 906 is input to the clock input ("CLK"), and the EEIN signal on line 908 is input to the data input ("D1") of EEPROM 124. The output of EEPROM 124 is the EEOUT signal on line 910. As is appropriate for the usage of this particular EEPROM, when the EESEL signal has a logic high value and the EECLK signal has successive low-to-high transitions, then values on EEIN are shifted in serially to the EEPROM to form access commands, memory addresses, and data to be stored in memory. Access commands may include read commands, in which case data is shifted out serially from the EEPROM to form successive values on the EEOUT signal, sent to the PEL, and read by the HMS. In general usage, the HMS monitors the EEOUT signal, and directs the EEIN, EESEL, and EECLK lines to the appropriate sequence of states as required to write and read the contents of the EEPROM.

It is desirable for the HMS to know when and where a DAB is connected. This is accomplished by presence detection circuitry 104 (FIG. 1). In the preferred embodiment, this circuitry includes line 106, connected to SIG GND line 254. Therefore, when the system connector 102 is mated with the connector of the PEL, the PRESENT* signal with a logic low value is provided at the appropriate system connector pin. The PEL sensing this state of the PRESENT* signal will process it and determine that a DAB is present at that location.

It is in the scope of the present invention that other circuitry could be used that would provide some other type of signal to indicate connection of the DAB and its location. Important here, however, is that there is a signal generated that is recognizable by the PEL and, therefore, by the HMS, which indicates that the DAB is present, and indicates where it is located.

The DAB indicators, shown generally at 140 of FIG. 1, are shown in detail in FIG. 24 at 950. Referring to FIG. 24, the DAB has two indicators: one indicates that the DAB is connected to the PEL and that HMEVCC is powering the HME, and the other indicates that the HME on the DAB is being evaluated by the HMS.

With respect to the first indicator, the HMEVCC signal on line 520 connects to the anode of light emitting diode ("LED") 954 and SIG GND line 254 connects to the cathode via line 956, having current-limiting resistor 958. Once the DAB and PEL are connected, and the HMEVCC signal ramps-up, LED 954 will light, indicating this condition.

With respect to the second indicator, the HMEVCC signal on line 520 connects to the anode of light emitting diode ("LED") 962 and INUSELED* line 146 connects to the cathode via line 964 having current-limiting resistor 966. The INUSELED* signal is from the PEL. When the HMS evaluates the HME, the level of the INUSELED* signal will change to the equivalent of a ground level signal. When the ground level signal is applied to the circuit, LED 962 will light.

Referring to FIG. 1, the DAB preferably has test points 148 that are connected to system connector 102 by line 150. The test points are for transmitting an output from the DAB to external equipment. The test points are used to synchronize operation of the external equipment with the operation of the HMS and HME.

There are two test points. The first is associated with the time period during which the HME is evaluated, i.e., from first to last patterns, and the second, the USER signal, is a pulsed signal to mark predetermined events. The first test point is typically the KEEPALIVE* signal. The second test point is used as desired by the software associated with the HMS. Two representative events that may be marked by pulses are the beginning and end of the HME evaluation period. However, it is clear that any event can be so marked and provided to an external device to function as a synchronization trigger.

Again referring to FIG. 1, the DAB has feedback connector 144. The feedback connector may consist of one or more pads. The feedback connector is jumpered to a pin or pins of the HME.

The signals from the HME that are transmitted via the feedback connector indicate the internal state of the HME. This is necessary because the HMS requires that the HME be at a predetermined state before beginning an evaluation. To reach this predetermined state, the HMS will provide certain stimulus to the pins of the HME and monitor the internal state of the HME through the signals received from feedback connector 144. When the consistent state is achieved, as represented by the feedback signals, the HME is considered initialized and restoration of the HME to the predetermined state can commence.

Once again referring to FIG. 1, analog sense connector 152 is connected to system connector 102 via line 154. The analog sense connector may consist of one or more pads. The analog sense connector is jumpered to an analog output or outputs of the HME. The analog sense connector provides the analog outputs of the HME directly the HMS via line 154 and system connector 102.

Monitoring the analog output provides information regarding the changes that occur in the HME during evaluation that would not be revealed if only the digital signals were monitored. For example, a principal output of an HME may take on a multi-valued analog level. This level can be directly measured by the HMS when connected to the analog sense connector, and the measured value used within the overall software application.

The terms and expressions which are used herein are used as terms of expression and not of limitation. And, there is no intention, in the use of such terms and expressions, of excluding the equivalents of the features shown and described, or portions thereof, it being recognized that various modifications are possible in the scope of the invention.

What is claimed is:

1. A connector configured for coupling to a hardware modeling system, the connector capable of receiving one of a plurality of electronic devices, wherein each electronic device of the plurality has a different pin-out configuration, wherein the hardware modeling system provides a plurality of electrical signals to an electronic device through the connector and evaluates performance and response of the electronic device, comprising:

a. a grid adapter comprising a matrix of connection pads for coupling to at least one of the electronic devices, wherein at least one of the connection pads is electrically coupled to another one of the connection pads;

b. one or more segments configured for mating to the hardware modeling system, for bi-directionally transmitting electrical signals between the connector and the hardware modeling system, each segment capable of receiving one or more electrical connections from the electronic device;

c. a generation circuit for generating and providing electrical signals to the electronic device through the electrical connections for powering the electronic device; and d. a memory circuit for storing and providing information to the hardware modeling system regarding predetermined characteristics of the electronic device.

2. The connector as claimed in claim 1 wherein the one or more segments include first, second, and third segments wherein the first segment comprises at least one pin that is longer than pins within the second and third segments and wherein the second segment comprises at least one pin that is longer than pins within the third segment.

3. The connector as claimed in claim 2 further comprising an insertion circuit including electrostatic charge dissipation circuitry coupled to the first segment for first mating with the hardware modeling system when the connector is inserted into the hardware modeling system to dissipate electrostatic charge.

4. The connector as claimed in claim 3 wherein the insertion circuit further includes ground equalization circuitry coupled to the second segment for mating with the hardware modeling system when the connector is inserted and after the electrostatic charge dissipation circuitry to equalize ground levels of the connector, the electronic device and the hardware modeling system.

5. The connector as claimed in claim 4 wherein the insertion circuit further includes power supply control circuitry coupled to the third segment for mating with the hardware modeling system when the connector is inserted and after the electrostatic charge dissipation circuitry and the ground equalization circuitry, to supply power from the hardware modeling system to the connector and the electronic device.

6. The connector as claimed in claim 5 wherein power is supplied from the hardware modeling system to the connector and the electronic device by linearly increasing a power supply voltage input based on a predetermined time constant.

7. The connector as claimed in claim 6 wherein more than one electronic device is coupled to the hardware modeling system at any given time.

8. The connector as claimed in claim 7 wherein the insertion circuit allows the connector to be connected to the hardware modeling system while the hardware modeling system is powered.

9. The connector as claimed in claim 8 wherein the electronic device is a hardware modeling element.

10. The connector as claimed in claim 1 wherein the generation circuit further comprises a voltage regulator coupled to the one or more segments for receiving a first signal from the hardware modeling system for forming a second signal and a switch for selecting one of the first signal and the second signal for powering the electronic device.

11. The connector as claimed in claim 1 further comprising means for refreshing the electronic device when the electronic device is un-accessed for a predetermined period of time.

12. The connector as claimed in claim 1 further comprising an indicator circuit for indicating when the system is powered by the hardware modeling system.

13. The system according to claim 12 wherein the indicator circuit also indicates when the hardware modeling system accesses the electronic device.

14. The connector as claimed in claim 1 wherein the information stored and provided by the memory circuit includes information about the electronic device and a configuration of the connector.

15. The connector as claimed in claim 1 wherein each of the electric signals corresponds to at least one of the connection pads.

16. The connector as claimed in claim 15 wherein the matrix of connection pads is electrically inter-coupled for receiving a plurality of different pin-out configurations for a selected class of electronic device, wherein the class is selected from the following classes of electronic devices: PGA, DIP, PLCC, and QFP.

17. The connector as claimed in claim 1 wherein a number of connection pads exceeds a number of electrical signals provided by the hardware modeling system.

18. A system for connecting one of a plurality of hardware modeling elements to a hardware modeling system that is capable of evaluating the performance of the hardware modeling element in response to stimuli provided by the hardware modeling system, wherein each hardware modeling element of the plurality has a plurality of signal pins arranged differently from another hardware modeling element of the plurality, comprising:

a. a connector having at least one segment for mating with a section of the hardware modeling system, such that a number of electrical signals can be bi-directionally transmitted between the connector and the hardware modeling system;

b. a grid adapter coupled to the connector and for coupling to the hardware modeling element for providing signals to the hardware modeling element and receiving signals from the hardware modeling element, the grid adapter having a matrix of connection pads for receiving the plurality of signal pins of the hardware modeling element wherein a first connection pad is electrically coupled to a second connection pad;

c. a generation circuit for generating and providing electrical signals to the hardware modeling element; and d. a memory circuit for storing and providing information to the hardware modeling system regarding predetermined characteristics of the hardware modeling element.

19. The system as claimed in claim 18 wherein the connector comprises first, second and third segments, wherein the first segment includes a first pin longer than a second pin within the second segment and longer than a third pin within the third segment, wherein the second pin is longer than the third pin.

20. The system as claimed in claim 19 further comprising an insertion circuit including electrostatic charge dissipation circuitry coupled to the first segment for mating with the hardware modeling system when the connector is first inserted into the hardware modeling system to dissipate electrostatic charge.

21. The system as claimed in claim 20 wherein the insertion circuit further includes ground equalization circuitry coupled to the second segment for mating with the hardware modeling system when the connector is inserted and after the electrostatic charge dissipation circuitry to equalize ground levels of the connector, the hardware modeling element and the hardware modeling system.

22. The system as claimed in claim 21 wherein the insertion circuit further includes power supply control circuitry coupled to the third segment for mating with the hardware modeling system when the connector is inserted and after the electrostatic charge dissipation circuitry and the ground equalization circuitry to supply power from the hardware modeling system to the connector and the hardware modeling element.

23. The system as claimed in claim 22 wherein the insertion circuit is further configured for supplying the power from the hardware modeling system to the connector and the hardware modeling element by linearly increasing a power supply voltage input based on a predetermined time constant.

24. The system as claimed in claim 23 wherein the insertion circuit allows the connector to be connected to the hardware modeling system while the hardware modeling system is powered.

25. The system as claimed in claim 24 wherein the generation circuit further comprises a voltage regulator coupled to the one or more segments for receiving a first signal from the hardware modeling system for forming a second signal and a switch for selecting one of the first signal and the second signal for powering the hardware modeling element.

26. The system as claimed in claim 25 further comprising a refreshing circuit for refreshing the hardware modeling element if the hardware modeling element is not accessed by the hardware modeling system for a predetermined period of time.

27. A hardware modeling system for simulating a circuit and providing signals to and measuring responses from a hardware modeling element comprising:
  a. a connector capable of being inserted to the hardware modeling system while the hardware modeling system is powered including:
    i. electrostatic charge dissipation circuitry to dissipate electrostatic charge;
    ii. a first segment including a first pin of a first length coupled to the electrostatic charge dissipation circuitry;
    iii. ground equalization circuitry to equalize ground levels of the connector, the hardware modeling system and the hardware modeling element;
    iv. a second segment including a second pin of a second length coupled to the ground equalization circuitry;
    v. power supply control circuitry to supply power from the hardware modeling system to the connector and the hardware modeling element;
    vi. a third segment including a third pin of a third length coupled to the power supply control circuitry;
  wherein the first length is longer than the second and third lengths and the second length is longer than the third length such that when the connector is inserted into the hardware modeling system, the first pin engages the hardware modeling system first, the second pin engages the hardware modeling system second and the third pin engages the hardware modeling system third;
  b. a grid adapter coupled to the connector and configured to receive the hardware modeling element for providing signals to the hardware modeling element and receiving signals from the hardware modeling element, the grid adapter comprising a matrix of connection pads arranged in concentric rectangular rings adapted for receiving one of a plurality of hardware modeling elements each having a different pin-out configuration, wherein at least one of the connection pads is electrically coupled to another one of the connection pads;
  c. a generation circuit for generating and providing electrical signals to the hardware modeling element including a voltage regulator coupled to the connector for receiving a first signal and forming a second signal, and a switch for selecting between a selective one of the first signal and the second signal for powering the hardware modeling element; and
  d. a memory circuit for storing and providing information to the hardware modeling system regarding predetermined characteristics of the hardware modeling element.

28. The system as claimed in claim 18 wherein a number of connection pads exceeds the number of electrical signals that can be bi-directionally transmitted between the connector and the hardware modeling system.

29. The system as claimed in claim 18 wherein the connection pads are arranged in concentric rectangular rings for accepting electronic devices having PGA pin-out package configurations.

30. The system as claimed in claim 29 wherein a first concentric rectangular ring comprises the first connection pad and a second concentric rectangular ring comprises the second connection pad.

31. The system as claimed in claim 18 wherein the connection pads are arranged in parallel rows for accepting electronic devices of different sizes having DIP pin-out package configurations.

32. The system as claimed in claim 31 wherein each of the connection pads of at least one parallel row is electrically coupled to a corresponding one of the connection pads of at least one other of the parallel rows.

33. The system as claimed in claim 18 wherein the connection pads are arranged in a first rectangular ring and a second rectangular ring, the first rectangular ring comprising 28 connection pads for accepting a first electronic device having a 28-pins PLCC pin-out package configuration, the second rectangular ring comprising 20 connection pads for accepting a second electronic device having a 20-pins PLCC pin-out package configuration, wherein the first rectangular ring and the second rectangular ring share at least two common pads.

34. The system as claimed in claim 33 wherein at least one of the connection pads of the first rectangular ring is electrically coupled to at least one of the connection pads of a side of the second rectangular ring.

35. A device adapter circuit board for interfacing between a hardware modeling system and one of a plurality of integrated circuits, wherein each integrated circuit of the plurality has a different footprint, comprising:
  a. a plurality of system connectors, each system connector having a plurality of signal lines coupled to the hardware modeling system for bi-directionally transmitting electrical signals between the hardware modeling system and the integrated circuit, wherein a total number of signal lines is not smaller than a number of pins of the integrated circuit; and
  b. a footprint adapter having a plurality of connection pads for coupling to the integrated circuit, wherein each signal line is electrically coupled to at least one connection pad, further wherein a number of connection pads exceeds the number of pins of the integrated circuit.

36. The device adapter circuit board as claimed in claim 35, wherein the connection pads are arranged in concentric rectangular rings for accepting PGA integrated circuits having different numbers of pins and pin-out configurations.

37. The device adapter circuit board as claimed in claim 36, wherein the concentric rectangular rings comprise an outer ring and an inner ring, further wherein at least one connection pad of the outer ring is electrically coupled to at least one connection pad of the inner ring.

38. The device adapter circuit board as claimed in claim 35, wherein the connection pads are arranged in a plurality of parallel rows for accepting integrated circuits having DIP pin-out package configuration and having different numbers of pins, wherein each connection pad in a first row is aligned directly across from a corresponding connection pad in a second row.

39. The device adapter circuit board as claimed in claim 38, wherein at least one connection pad of the first row is electrically coupled to at least one connection pad of the second row.

40. The device adapter circuit board as claimed in claim 35, wherein the connection pads are arranged in a first rectangular ring and a second rectangular ring, the first rectangular ring having 28 connection pads for accepting an electronic device having a 28-pins PLCC pin-out package configuration, the second rectangular ring having 20 connection pads for accepting an electronic device having a 20-pins PLCC pin-out package configuration, wherein the first rectangular ring and the second rectangular ring share at least two common pads.

41. The device adapter circuit board as claimed in claim 40 wherein at least one of the connection pads of a side of the first rectangular ring is electrically coupled to at least one of the connection pads of a side of the second rectangular ring.

42. A method of providing electrical connections between a hardware modeler and hardware modeling elements having different footprint dimensions, the method comprising the steps of:
a. providing a two-dimensional array of connector sockets;
b. identifying a first plurality of the connector sockets corresponding to a first footprint dimension;
c. connecting each of the first plurality of connector sockets to the hardware modeler;
d. identifying a second plurality of the connector sockets corresponding to a second footprint dimension, wherein the second plurality includes a subset of the first plurality; and
e. connecting each of the second plurality of connector sockets excluded by the subset to each of the first plurality of the connector sockets excluded by the subset, whereby each of the second plurality of the connector sockets are electrically coupled to the hardware modeler.

43. The method according to claim 42 wherein the hardware modeling elements belong to a same class of pin-out configurations.

44. The method according to claim 43 further comprising the step of repeating the steps b–e for other footprint dimensions within the same class of pin-out configurations.

45. The method according to claim 42 wherein the hardware modeling elements have a 240 pin PGA pin-out configuration.

46. An adapter circuit board for providing electrical connections between hardware modeling elements having a different footprint dimensions and a hardware modeler, the adapter circuit board comprising:
a. a first plurality of connector sockets configured for receiving hardware modeling elements having a first footprint dimension, wherein each of the first plurality of connector sockets is configured for connecting to the hardware modeler;
b. a second plurality of connector sockets configured for receiving hardware modeling elements having a second footprint dimension, wherein the second plurality of connector sockets include a subset of the first plurality of connector sockets, further wherein the second plurality of connector sockets excluded by the subset are electrically coupled to the first plurality of connector sockets excluded by the subset, whereby the second plurality of connector sockets are electrically coupled to the hardware modeler.

47. The adapter circuit board according to claim 46 wherein the adapter circuit board is configured to receive hardware modeling elements belonging to a same class of pin-out configurations.

48. The adapter circuit board according to claim 46 wherein the adapter circuit board is configured to receive hardware modeling elements having a 240 pin PGA pin-out configuration arranged in different footprint dimensions.

49. The adapter circuit board according to claim 46 further comprising a connector for coupling to the hardware modeler.

50. The adapter circuit board according to claim 49 wherein the connector further comprises an insertion circuit including electrostatic charge dissipation circuitry configured to effect first contact with the hardware modeler during mating, ground equalization circuitry configured to effect second contact with the hardware modeler, and power supply circuitry configured to effect third contact with the hardware modeler.

51. A connector capable of coupling to each of a class of electronic devices wherein each of the class of electronic devices has a different pin-out configuration, the connector configured for receiving input signals from a hardware modeling system, coupling to a selected electronic device from the class of electronic devices wherein the selected electronic device has a selected pin-out configuration, providing the input signals from the hardware modeling system to the selected electronic device, receiving a device signal from the selected electronic device and providing the device signal to the hardware modeling system for evaluating performance and response of the selected electronic device, the connector comprising:
a. a connection pad matrix including:
(a) a plurality of connection pads configured for coupling to the different pin-out configurations of the class of electronic devices, wherein the plurality of connection pads includes a plurality of footprint pads configured for mating with the selected pin-out configuration and receiving the device signal from the selected electronic device;
(b) one or more segments configured for mating with the hardware modeling system, receiving the input signals and bi-directionally transmitting electrical signals between the selected electronic device and the hardware modeling system, wherein each segment is configured for receiving one or more electrical connections from the selected electronic device;
b. a grid adaptor coupled to the connection pad matrix and configured for electrically coupling at least one of the plurality of connection pads to another of the plurality of connection pads such that each of the plurality of footprint pads is coupled to a corresponding one of the one or more segments thereby configuring the plurality of connection pads for mating with the selected pin-out configuration;
c. a generation circuit coupled to the connection pad matrix and configured for generating and providing a power signal to the selected electronic device through the electrical connections; and
d. a memory circuit coupled to the connection pad matrix and configured for storing information regarding predetermined characteristics of the selected electronic device and providing the information to the hardware modeling system.

52. The connector as claimed in claim 1 wherein the one or more segments include first, second, and third segments wherein the first segment comprises at least one first pin that is longer than pins within the second and third segments and wherein the second segment comprises at least one second pin that is longer than pins within the third segment.

53. The connector as claimed in claim 2 further comprising an insertion circuit including electrostatic charge dissipation circuitry coupled to the first segment and configured for first mating with the hardware modeling system when the connector is inserted into the hardware modeling system to dissipate electrostatic charge.

54. The connector as claimed in claim 3 wherein the insertion circuit further includes ground equalization circuitry coupled to the second segment and configured for mating with the hardware modeling system after the electrostatic charge dissipation circuitry is mated with the hardware modeling system and equalizing ground levels of the connector, the selected electronic device and the hardware modeling system.

55. The connector as claimed in claim 4 wherein the insertion circuit further includes power supply control circuitry coupled to the third segment and configured for mating with the hardware modeling system after the electrostatic charge dissipation circuitry and the ground equalization circuitry are mated to the hardware modeling system, and supplying power from the hardware modeling system to the connector and the selected electronic device.

56. The connector as claimed in claim 5 wherein the power supply control circuitry is further configured for supplying the power from the hardware modeling system to the connector and the selected electronic device by linearly increasing a power supply voltage input based on a predetermined time constant.

57. The connector as claimed in claim 6 wherein the connection pad matrix is further configured for receiving a plurality of electronic devices selected from the class of electronic devices at any given time.

58. The connector as claimed in claim 7 wherein the insertion circuit is further configured for allowing the one or more segments to be connected to the hardware modeling system while the hardware modeling system is powered.

59. The connector as claimed in claim 8 wherein the selected electronic device is a hardware modeling element.

60. The connector as claimed in claim 1 wherein the generation circuit further comprises:
   (2) a voltage regulator coupled to the one or more segments and configured for receiving a first signal from the hardware modeling system, and forming a second signal; and
   (3) a switch coupled to receive the first signal and the second signal and configured for selecting one of the first signal and the second signal for powering the selected electronic device.

61. The connector as claimed in claim 1 further comprising refresh circuitry coupled to the connection pad matrix and configured for refreshing the selected electronic device when the selected electronic device is idle for a predetermined period of time.

62. The connector as claimed in claim 1 further comprising an indicator circuit coupled to the connection pad matrix and configured for indicating when the selected electronic device is powered by the hardware modeling system.

63. The connector according to claim 12 wherein the indicator circuit is further configured for indicating when the hardware modeling system accesses the selected electronic device.

64. The connector as claimed in claim 1 wherein the information stored and provided by the memory circuit further includes information about a configuration of the connector.

65. The connector as claimed in claim 1 wherein each of the input signals provided by the hardware modeling system corresponds to at least one of the plurality of connection pads.

66. The connector as claimed in claim 1 wherein the class of electronic devices is selected from the following classes of electronic devices: PGA, DIP, PLCC, and QFP.

67. The connector as claimed in claim 1 wherein a number of the plurality of connection pads exceeds a number of the input signals provided by the hardware modeling system.

68. The adapter circuit board according to claim 46 further comprising a connector coupled to the first plurality of connector sockets and configured for coupling to the hardware modeler.

69. The adapter circuit board according to claim 49 further comprising an insertion circuit coupled to the connector and including electrostatic charge dissipation circuitry configured to effect first contact with the hardware modeler during mating, ground equalization circuitry configured to effect second contact with the hardware modeler, and power supply circuit configured to effect third contact with the hardware modeler.

* * * * *

UNITED STATES PATENT AND TRADEMARK OFFICE
CERTIFICATE OF CORRECTION

PATENT NO.   : 6,148,275
DATED        : November 14, 2000
INVENTOR(S)  : Papamarcos et al.

It is certified that error appears in the above-identified patent and that said Letters Patent is hereby corrected as shown below:

Title page:

In the Reference cited [56]:

The following U.S. Patent Documents need to be added:

-- 5,425,036   6/1995   Liu et al.   371/23 --.

The following Foreign Patent Documents need to be added:

| | | | | |
|---|---|---|---|---|
| -- 150260A2 | 7/1985  | European Pat. Off. | G06F | 11/26 |
| 1 444 084   | 7/1976  | United Kingdom     | H03K | 19 00 |
| 58-205870   | 11/1983 | Japan              | H03K | 19 00 |
| 59-161839   | 9/1984  | Japan              | H01L | 21/82 |
| 1-154251    | 6/1989  | Japan              | G06F | 11/26 |
| 2123156A    | 1/1984  | United Kingdom     | G01R | 19/165 |
| 2164768A    | 3/1984  | United Kingdom     | G06F | 15/16 --. |

The following Other Publications need to be added:

-- Widdoes, L.C., Jr., and Harding, W., "CAE Station Uses Real Chips to Simulate VLSI-Based Systems," Electronic Design, Mar.22,1984, pp. 167-176.
Stoll, P., PMX: A Hardware Solution to the VLSI Model Availability Problem," IEEE Proceedings of the International Conference on Computer Design, Oct., 1985.
Johnson, P., "Considerations in Selecting a Physical Modeling System," ADEE Technical Session Proceedings, Sept., 1986, pp. 225-231.
Johnson, P., "Software vs. Hardware Models for Simulation," Design Automation Guide, 1988.
Bisset, S., "LSI Tester Gets Microprocessors to Generate Their Own Test Patterns," Electronics, May 25, 1981, pp. 79-84.
Albrow, R., "2-Head Auto-Test System Takes On Complex VLSI," Electronic Design, Mar. 5, 1981, pp.79-84.
Giles, D., and Bowden, K., "Maintaining Simulation Accurance Through Physical Device Models," IEEE Proceedings of the International Test Conference, 1985.
Parker, Integrating Design and Test: Using CAE Tools for ATE Programming, Computer Society Press of the IEEE, 1987, ISBN No. 08-8186-8788-5.
Widdoes, L.C., Jr., and Stump, H., "Hardware Modeling," VLSI Systems Design, July, 1988.

UNITED STATES PATENT AND TRADEMARK OFFICE
CERTIFICATE OF CORRECTION

PATENT NO.   : 6,148,275
DATED        : November 14, 2000
INVENTOR(S)  : Papamarcos et al.

Page 2 of 2

It is certified that error appears in the above-identified patent and that said Letters Patent is hereby corrected as shown below:

Gillette, G., "Tester Takes on VLSI with 264-K Vectors Behind Its Pins," Electronics, Nov. 3, 1981, pp. 122-127.
Koike, N., Omori, K., and Sasaki, T. "HAL: A High-Speed Logic Simulation Machine, IEEE, October, 1985.
Blank, T. "A Survey of Hardware Accelerators Used in Computer-Aided Design," IEEE, August, 1984.
Beece, D., Papp, G., and Villante, F., "The IBM Engineering Verification Engine," Information Processing Society of Japan, June 10, 1987.
Arkos, "Hydra Logic Processor Chip Description, Version C," February 15, 1995.
XILINX, The Programmable Gate Array Data Book, 1/279-477, 1988.
"Testing a TV Character Generator with the Sentry II Sequence Processor," Fairchild Systems Technology, Fairchild Technical Bulletin 4, Nov. 1974, pp. 1-12.
Huston, R., "Description of the Intel 8085 Microprocessor Test Programs for the Sentry II/VII with Sequence Processor Module," Fairchild Systems Technology, November 1977, pp. 1-12.
U.S. Patent Application Serial No. 08/518,134 filed 10/25/74. --.

Signed and Sealed this

Twenty-seventh Day of November, 2001

Attest:

NICHOLAS P. GODICI
Attesting Officer    Acting Director of the United States Patent and Trademark Office